United States Patent
Zhao et al.

(10) Patent No.: US 7,060,557 B1
(45) Date of Patent: Jun. 13, 2006

(54) FABRICATION OF HIGH-DENSITY CAPACITORS FOR MIXED SIGNAL/RF CIRCUITS

(75) Inventors: Bin Zhao, Irvine, CA (US); Qizhi Liu, Essex Junction, VT (US); Maureen R. Brongo, Laguna Hills, CA (US)

(73) Assignee: Newport Fab, LLC, Inc., Newport Beach, CA (US)

( * ) Notice: Subject to any disclaimer, the term of this patent is extended or adjusted under 35 U.S.C. 154(b) by 79 days.

(21) Appl. No.: 10/190,297

(22) Filed: Jul. 5, 2002

(51) Int. Cl.
*H01L 21/8242* (2006.01)

(52) U.S. Cl. .................. 438/253; 438/396; 438/240

(58) Field of Classification Search ........ 438/239–242, 438/253–256, 396–399, 3
See application file for complete search history.

(56) References Cited

U.S. PATENT DOCUMENTS

| | | | | |
|---|---|---|---|---|
| 4,437,139 A | * | 3/1984 | Howard | 361/313 |
| 5,943,580 A | * | 8/1999 | Ramakrishnan | 438/381 |
| 6,218,260 B1 | * | 4/2001 | Lee et al. | 438/398 |
| 6,248,640 B1 | * | 6/2001 | Nam | 438/396 |
| 6,355,521 B1 | * | 3/2002 | Cho | 438/254 |
| 6,365,486 B1 | * | 4/2002 | Agarwal et al. | 438/393 |
| 6,486,021 B1 | * | 11/2002 | Kim et al. | 438/240 |
| 6,645,853 B1 | * | 11/2003 | Ngo et al. | 438/637 |
| 6,762,090 B1 | * | 7/2004 | Ahn et al. | 438/239 |
| 6,803,306 B1 | * | 10/2004 | Tsau | 438/622 |
| 6,838,352 B1 | * | 1/2005 | Zhao | 438/386 |
| 2002/0038903 A1 | * | 4/2002 | Tsau | 257/532 |
| 2002/0155676 A1 | | 10/2002 | Stetter et al. | 438/396 |
| 2003/0025143 A1 | * | 2/2003 | Lin et al. | 257/303 |

* cited by examiner

*Primary Examiner*—Jennifer Kennedy
(74) *Attorney, Agent, or Firm*—The Eclipse Group

(57) ABSTRACT

A method for fabricating a capacitor on a semiconductor substrate is disclosed. The method may include simultaneously forming at least one via and at least one upper capacitor plate opening in a first dielectric layer having an underlying cap dielectric layer deposited over a first material region having a first conductive material within a conductive region and forming a trench above the via. The underlying cap dielectric layer may be modified in a way that increases its dielectric constant as a result of simultaneously be heated by a heat source and impinged with and energy beam. The method may also include filling the via, trench, and upper capacitor plate opening with a second conductive material resulting in an integrated circuit structure and employing CMP to remove any excess second conductive material from the integrated circuit structure.

13 Claims, 41 Drawing Sheets

FABRICATION OF HIGH-DENSITY CAPACITORS FOR MIXED SIGNAL/RF CIRCUITS

FIELD OF THE INVENTION

This invention relates generally to a system and method for fabricating high-density capacitors. More particularly, this invention relates to a system and method for fabricating high-density on-chip capacitors utilized in mixed-signal/radio frequency integrated circuits.

RELATED ART

As integrated circuit ("IC") designs have progressed, there has been an increased interest in integrating several different functions on a single chip while minimizing process complexity and any resulting impact on manufacturing yield. This integration of several different functions on a single chip often known as "system on a chip" integration and requires components to be combined in a modular manner thus allowing designers to reuse the same integrated components in various products.

Additionally, the rapid development of telecommunication systems has generated a need for mixed-signal/radio frequency ("RF") ICs. On-chip integrated capacitors are very important for both mixed signal ICs, RF ICs, system-on-a-chip applications and new mixed-signal/RF ICs (that combine mixed signal ICs and RF ICs into one chip) because these passive elements typically perform numerous functions such as analog signal manipulation, direct current ("DC") offset cancellation, charge distribution, filtering, analog-to-digital ("A/D") and digital-to-analog ("D/A") conversion, etc. High performance mixed signal and RF circuits built on CMOS and BiCMOS technologies typically need integrated capacitors having low voltage coefficients, precisely controlled capacitor values, good capacitor matching, low parasitics, low defect density, and high reliability.

One significant challenge is how to monolithically integrate these passive elements on IC chips at minimal cost and with minimum chip estate (i.e., minimize the circuit area size). The need for high-density on-chip integrated capacitors with reduced chip size and minimal cost is especially important for new mixed-signal/RF IC technology.

Past attempts at producing integrated capacitors include traditional on-chip planar capacitors and comb on-chip capacitors. However, while traditional on-chip planar capacitors generally possess good precision, good matching, low parasitics, high quality factor ("Q") and high density, these traditional on-chip planar capacitors typically require additional masks and process steps to fabricate the capacitor electrodes. Furthermore, traditional on-chip planar capacitors are formed in a subtractive process architecture where the subtractive process is a direct etch of the interconnect and the electrode.

Alternatively, traditional comb on-chip capacitors involve fabricating alternating metal lines for the capacitors that may be performed at the same time as fabricating the metal lines for IC interconnects. However, comb on-chip capacitors typically possess undesirable characteristics such as difficulty in control capacitance precision, relatively poor capacitance matching, layout dependence, and low Q that results from large metal line resistance.

Additional problems with on-chip planar capacitors includes the modern trend to switch from silicon dioxide and aluminum to low dielectric constant ("low-k") materials and copper interconnect materials. The move from utilizing silicon dioxide, having a dielectric constant of approximately 4 as an inter-metal dielectric to materials with a low k, i.e. a dielectric constant values of less than 4, is driven by the desire to further reduce signal propagation delays, i.e. increase circuit speed, and reduce cross-talk noise. The desire to reduce signal propagation delays and increase circuit reliability is also driving the change from utilizing aluminum in interconnects to utilizing copper that has a lower electrical resistance and better electromigration resistance than aluminum. In general, this trend has resulted in a number of fundamental changes in IC fabrication.

Another problem with past approaches to fabricate traditional on-chip planar capacitors is that they generally only provide a medium density capacitance and still typically occupy a large chip area. Additionally, the comb capacitors typically cannot provide high-density capacitance either because the spacing between metal lines generally cannot be smaller than the smallest dimension that photolithography may provide.

An additional problem is that it is difficult to fabricate high dielectric constant ("high-k") materials. Some of the most promising high-k capacitor dielectrics include Tantalum Pentoxide ("$Ta_2O_5$"), Barium Strontium Titanate ("BST") and others. However, it is known that higher dielectric values (dielectric values that are greater than twice the standard dielectric value) and other improved dielectric properties are typically obtained by annealing these high-k materials at a temperature above 600 centigrade ("C"). As an example, $Ta_2O_5$ typically has a dielectric constant value of approximately 22 (k=22). After annealing $Ta_2O_5$ at a temperature greater to or equal than 600C, the dielectric constant value of $Ta_2O_5$ becomes greater than 40 (k>40), about twice the un-annealed dielectric constant value. Unfortunately, this type of temperature is not compatible with back end of line ("BEOL") type processes because typical low-k materials are not stable above 450C. As such, at present, the integration of high-k capacitor dielectrics with advanced interconnects (such as Copper "Cu" and/or low-k dielectric material) seems very difficult.

Therefore, there is a need for a process that allows for the utilization of high-k dielectric material in the fabrication of on-chip capacitors that possess high capacitance precision, accurate capacitance matching, and high Q, which results from lower series resistance of the electrodes, and a method for fabricating the on-chip capacitors where the fabrication method is compatible with existing processes.

SUMMARY

A method for fabricating a capacitor on a semiconductor substrate is disclosed. In one example embodiment, the method may include simultaneously forming at least one via and at least one upper capacitor plate opening in a first dielectric layer. The first dielectric layer may have an underlying cap dielectric layer deposited over a first material region. The cap dielectric layer may have its dielectric constant increased by simultaneously heating and impinging the cap dielectric with a heat source and an energy beam. The first material region may have a first conductive material within a conductive region. The method may also include forming a trench above the via and filling the via, trench, and upper capacitor plate opening with a second conductive material resulting in an integrated circuit structure. Additionally, the method may include employing CMP to remove any excess second conductive material from the integrated circuit structure.

As a result of performing this method an integrate circuit ("IC") may be formed. The IC may have a bottom electrode and an interconnect material disposed in a first material level, and an insulating dielectric layer above the first material level where the insulating dielectric layer may have had its dielectric constant increased by simultaneously heating and impinging the insulating dielectric layer with a heat source and an energy beam. The IC may include a via having a via height, where the via may be connected to the interconnect material, and a trench having a trench height located in a second material level and connected to the via. The IC may also include an upper capacitor plate opening having an upper capacitor plate opening height, where the upper capacitor plate opening height is approximately equal to a combined height of the via height and the trench height.

In another example embodiment, the method for fabricating an on-chip capacitor may include simultaneously forming at least one via and at least one upper capacitor plate opening in a first dielectric layer having an underlying first capacitance dielectric layer deposited over a first material level, where the capacitance dielectric layer may have had its dielectric constant increased by simultaneously heating and impinging the capacitance dielectric layer with a heat source and an energy beam. The first material level may have a first conductive material within a conducting region. The method may also include removing the first capacitance dielectric layer from a bottom of the via and a bottom of the upper capacitor plate opening resulting in a initial chip structure. Additionally, the method may include depositing a capacitor dielectric on the initial chip structure, forming a trench above the via and depositing a second conductive material layer to fill the via, trench and upper capacitor plate opening resulting in an intermediate chip structure. The method may also include employing CMP to remove excess second conductive material from the intermediate chip structure.

As a result of performing this method, another example IC may be formed. The IC may have a bottom electrode and an interconnect material disposed in a first material level, and an insulating dielectric layer having an insulating dielectric layer thickness above the first material level, where the insulating dielectric layer may have had its dielectric constant increased by simultaneously heating and impinging the insulating dielectric layer with a heat source and an energy beam. The IC may include a via having a via height, where the via is connected to the interconnect material, and a trench having a trench height located in a second material level and connected to the via. The IC may also include an upper capacitor plate opening having an upper capacitor plate opening height, where the upper capacitor plate opening height combined with the insulating dielectric layer thickness is approximately equal to a combined height of the via height and the trench height.

In yet another example embodiment, the method for fabricating an on-chip capacitor may include simultaneously forming at least one via and at least one upper capacitor plate opening in a first dielectric layer having an underlying first capacitance dielectric layer deposited over a first material level having a first conductive material within a conducting region. The method may also include removing the first capacitance dielectric layer from a bottom of the via and a bottom of the upper capacitor plate opening resulting in an initial chip structure. Additionally, the method may also include forming a trench above the via, depositing a capacitor dielectric on the initial chip structure, and depositing a second conductive material layer to fill the via, trench and upper capacitor plate opening resulting in an intermediate chip structure. The capacitor dielectric may have had its dielectric constant increased by simultaneously heating and impinging the capacitor dielectric with a heat source and an energy beam. Yet additionally, the method may include employing CMP to remove excess second conductive material from the intermediate chip structure.

As a result of performing this method, yet another example IC may be formed. The IC may have a bottom electrode and an interconnect material disposed in a first material level, and an insulating dielectric layer having an insulating dielectric layer thickness above the first material level, where the insulating dielectric layer may have had its dielectric constant increased by simultaneously heating and impinging the insulating dielectric layer with a heat source and an energy beam. The IC may include a via having a via height, where the via is connected to the interconnect material, and a trench having a trench height located in a second material level and connected to the via. The IC may also include a corrugated upper capacitor plate opening having an corrugated upper capacitor plate opening height and a second conductive material disposed between the bottom electrode and the insulating dielectric layer within the corrugated upper capacitor plate opening, the second conductive material electrically connected to the bottom electrode and the second conductive material having a second conductive material thickness. Additionally, the IC may include a third conductive material disposed on top of the insulating dielectric layer within the corrugated upper capacitor plate opening, the third conductive material having a third conductive material thickness.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

DETAILED DESCRIPTION

The trend in the semiconductor industry is to decrease the device feature sizes and improve the on-chip speed of integrated circuits ("ICs"). This trend has benefited from the utilization of copper interconnects and insulating materials having a low dielectric constant ("low k"). Accordingly, the ability to meet manufacturing process yield targets and device reliability targets has become increasingly difficult. In order to accommodate this trend and still meet yield and reliability targets, improved methodologies are needed to fabricate integrated circuits and their corresponding component parts.

Figure 1:
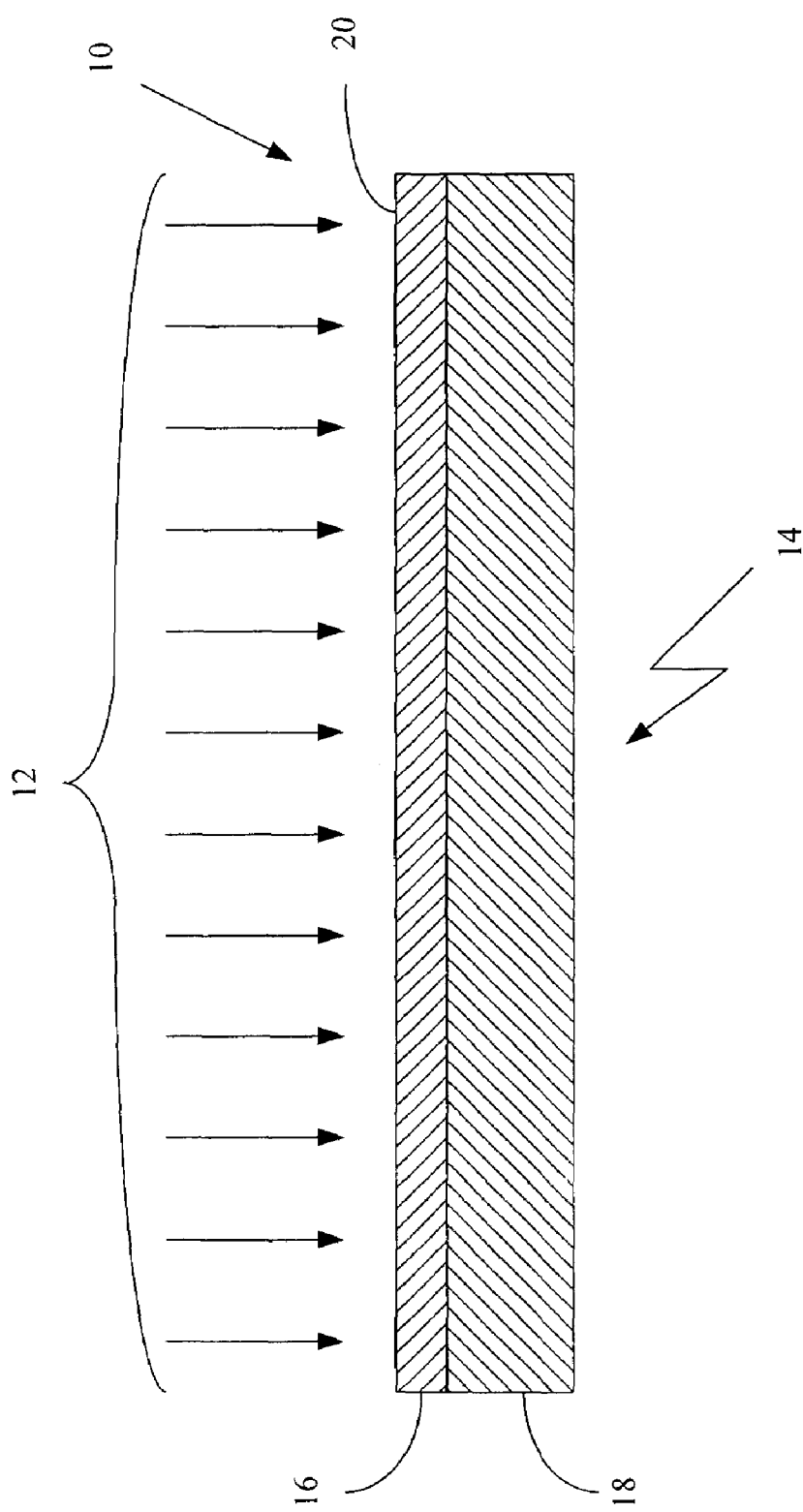
FIG. 1 is a cross-section of part of an integrated circuit ("IC") being impinged with an energy beam while being annealed with heat source in accordance with the invention.

This invention generally involves fabricating high-density on-chip capacitors utilizing an annealing process that includes a heating and energy beam impingement process. In FIG. 1, an IC structure 10 is shown being impinged with an energy beam 12 while being heated with heat source 14. The heat source 14 may be applied from below (as shown) or from all sides as in an oven-type environment (not shown). The heat source 14 may raise the temperature of the IC structure 10 to a temperature equal to or below 450C. Preferably this temperature may be below 400C. The IC structure 10 may include a dielectric layer 16 on a semiconductor wafer 18. The energy beam 12 may include any type of appropriate energy such as but not limited to an electron-beam, electromagnetic radiation, radio frequency ("RF"), microwave radiation, millimeter wave radiation, ion-beam, light beam, ultra-violet light or other similar type of energy injection. The energy beam 12 may preferably be directed towards the IC 10 as a plan wave so that the entire surface area 20 of the dielectric layer 16 is impinged equally with the energy beam 12.

As such, one methodology for fabricating a planar on-chip capacitor having high precision, good matching, low parasitics, high Q, and medium to high density at low cost is shown in FIGS. 2 through 9. The process starts with a semiconductor wafer substrate. In some applications, the process may begin with previously fabricated devices and/or interconnect structures. Beginning with the wafer substrate, a material layer having conductive regions separated by insulating regions is deposited followed by a cap layer covering the material layer. Dual damascene processing is then applied to fabricate planar on-chip capacitors that are formed without additional mask or process steps.

Figure 2:
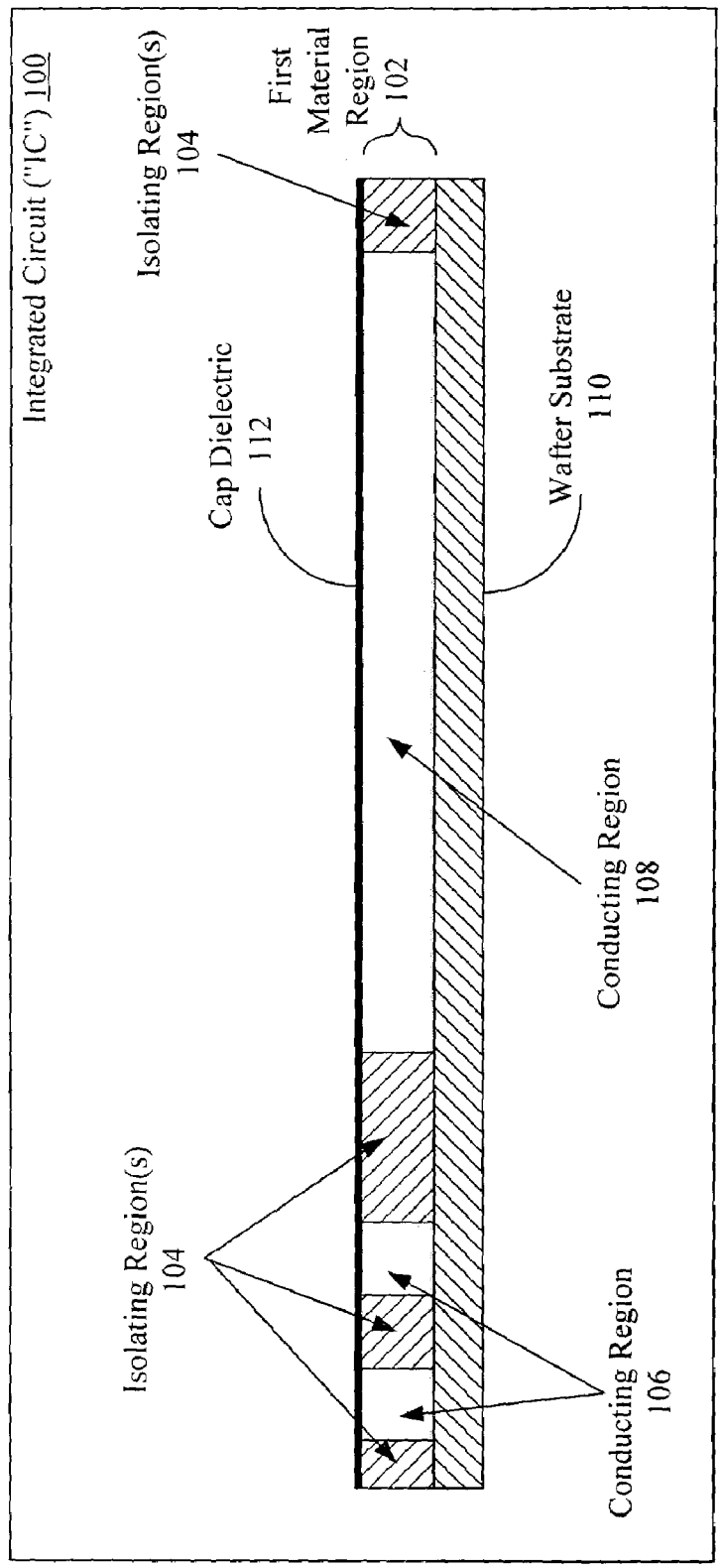
FIG. 2 is a cross-section of part of the IC having a first material layer that includes conductive material regions separated by insulating material regions on a substrate, and a cap dielectric layer deposited over the conductive and the insulating materials.

In FIG. 2, part of a cross-section of an IC 100 is shown. IC 100 may be formed with known processing and is shown having a first material layer 102. The first material layer 102 (also known as the "first material layer" or "first material level") includes an insulating region(s) 104 and conducting regions 106 and 108 over a wafer substrate 110 and is typically about 3000 angstrom ("Å") to 10 kilo-angstroms ("kÅ") in thickness. The insulating region(s) 104 may be a dielectric such as silicon oxide where the insulating region(s) 104 isolates conductive region(s) 106 and 108. Conductive regions 106 may be interconnect regions composed of interconnect material that allow electrical connections between different levels or layers of material. Conductive region 108 may have a first conductive material that may serve as a lower capacitor plate (also known as the "bottom electrode" or "lower capacitor electrode") on top of the wafer substrate 110. The conductive regions 106 and 108 may be formed by any appropriate conductive material such as, but not limited to, metal (such as copper and its barrier layer materials, aluminum or other equivalent type conductive material), a polysilicon, or diffusion area on a silicon substrate. A cap dielectric layer 112 is deposited over the material layer 102. The cap dielectric layer 112 may be an insulating dielectric layer. The cap dielectric layer 112 may be utilized as a capacitor dielectric in forming a planar on-chip capacitor. The dielectric layer 112 is usually about 100 Å to 1000 Å in thickness. The cap dielectric layer 112 may also serve as a diffusion barrier if the conductive regions 106 and 108 are formed with copper. Examples of the dielectric layer 104 include, but are not limited to, silicon dioxide ("$SiO_2$"), doped silicon oxide, and low-k materials. Examples of the cap dielectric layer 112 include, but are not limited to, silicon nitride ("SiN"), Silicon Carbide ("SiC"), Alumina ("$Al_2O_3$"), and other high k materials such as Hafnium dioxide ("$HfO_2$"), HfON, HfSiON, Zirconium Oxide ("$ZrO_2$") and ZrON.

Figure 3:
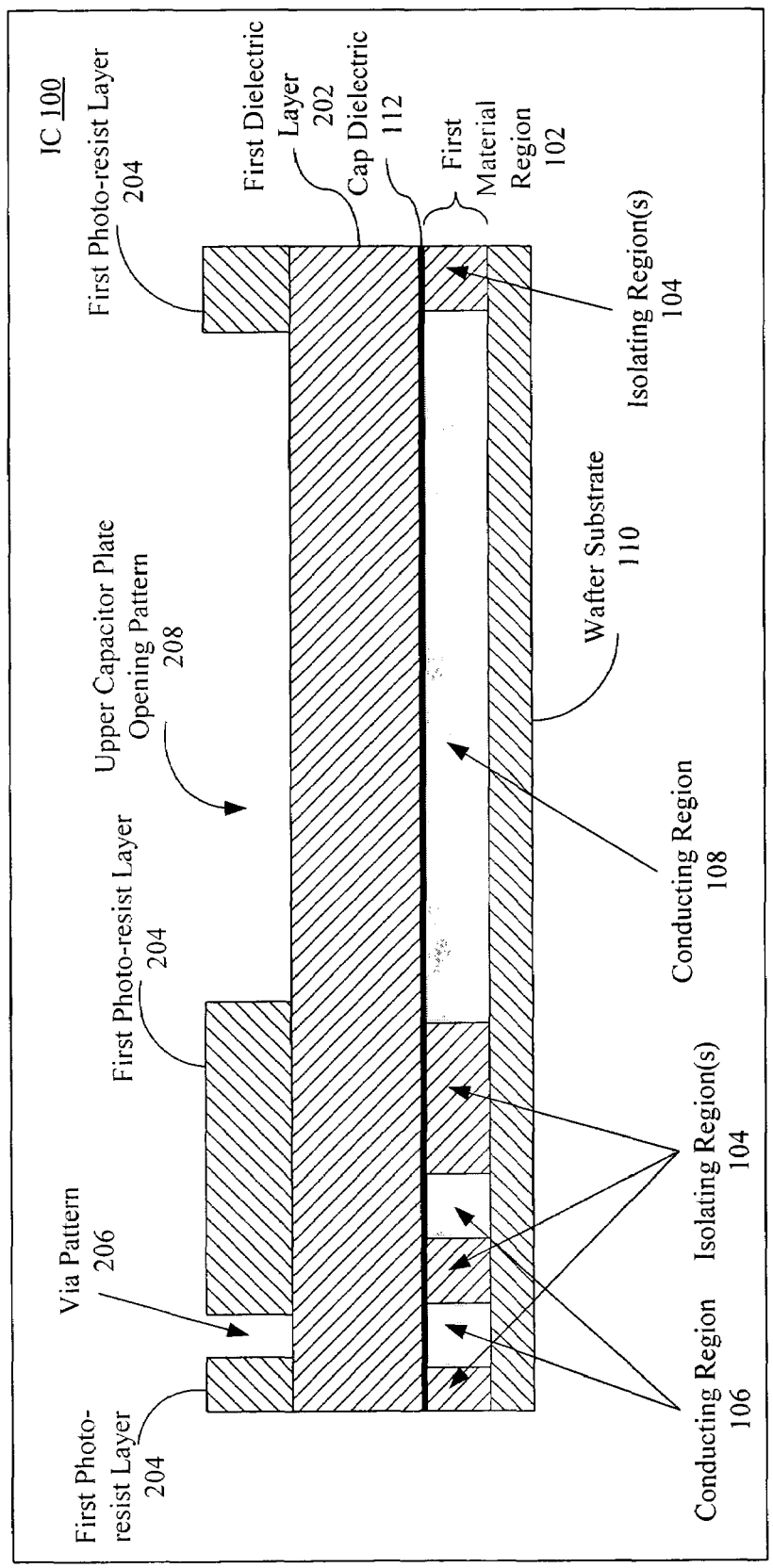
FIG. 3 is a cross-section of the partial IC shown in FIG. 2 after depositing a first dielectric layer over the IC shown in FIG. 2 and applying a first photo-resist over the first dielectric layer to form a pattern for a via and an upper capacitor plate opening.

The result of the first step in an example method for fabricating a planar on-chip capacitor on an IC 100 is shown in FIG. 3. The step includes simultaneously forming at least one via and at least one opening for an upper capacitor plate in a first dielectric material 202, which is deposited on the top surface of the structure shown in FIG. 3. The first dielectric material 202 defines the second material level, which is disposed on top of the fin first material level. The dielectric layer 202 may be approximately 3000 Å to 10 kÅ in thickness. The step of simultaneously forming the via and upper capacitor opening may include numerous sub-steps applied over the cap dielectric layer 112. This may be accomplished by depositing the first dielectric layer or layers 202 with $SiO_2$, doped silicon oxide, low-k materials, an etch stop layer such as SiN or SiC, and/or a stack using a plurality of these materials. Another sub-step may include applying a first photo-resist layer 204 over the first dielectric layer 202 to form a via pattern 206 and an upper capacitor plate opening pattern 208.

Figure 4:
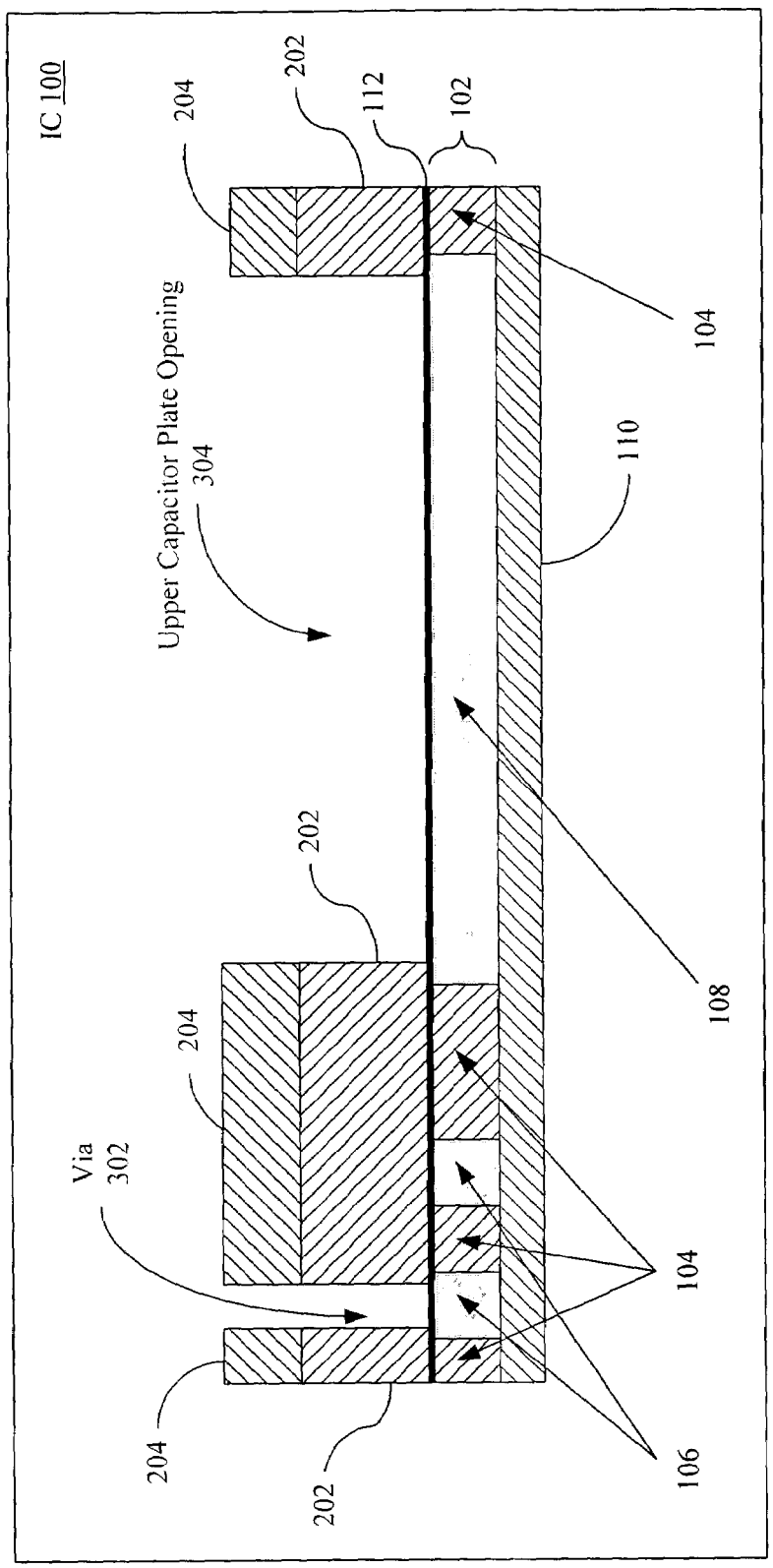
FIG. 4 is a cross-section of the partial IC shown in FIG. 3 after etching the via and upper capacitor plate opening into the first dielectric layer.

The etching of IC 100 is illustrated in FIG. 4. The etching sub-step may include etching a via 302 and an upper capacitor plate opening 304 in the first dielectric layer 202. Then in FIG. 5A, the first photo-resist layer 204 on the first dielectric layer 202, shown in FIG. 4, is stripped away from IC 100 in a stripping sub-step, leaving an exposed via 402 and upper capacitor plate opening 404 within the dielectric layer 202. It is appreciated by those skilled in the art that the etch process is selective in that etch chemistry is chosen to remove the first dielectric layer 202 without etching through cap dielectric layer 112.

Figure 5A:
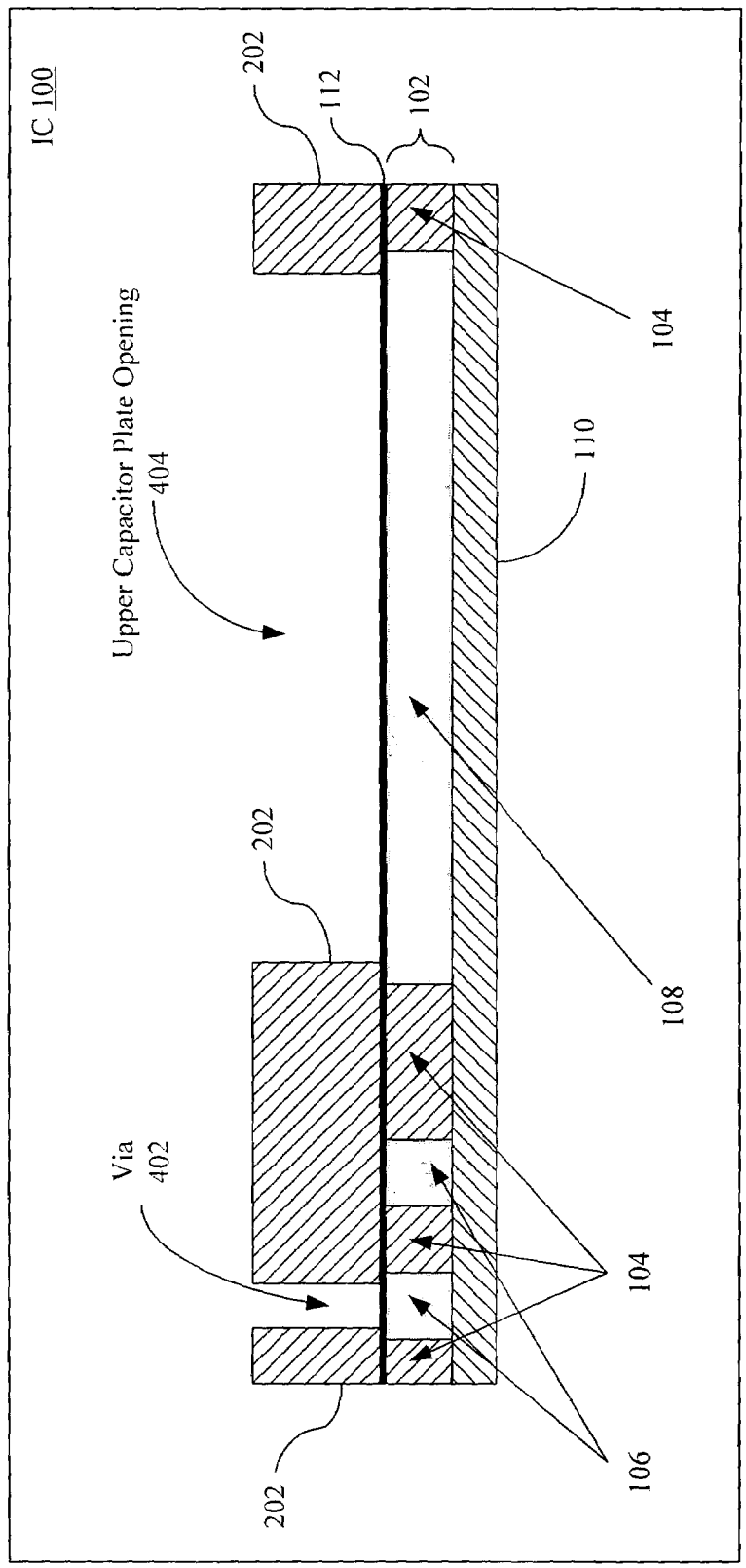
FIG. 5A is a cross-section of the partial IC shown in FIG. 4 after stripping away the first photo-resist.
Figure 5B:
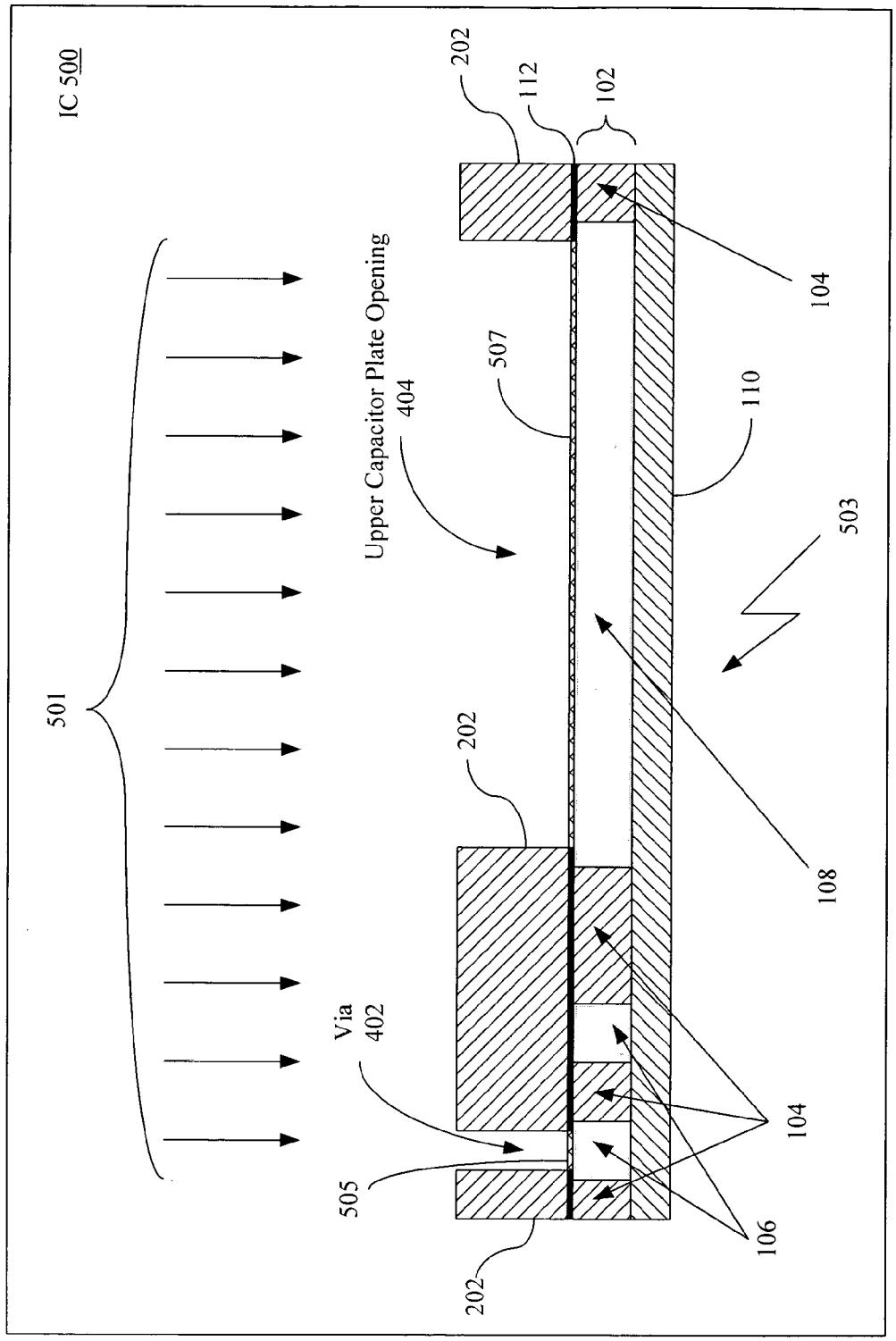
FIG. 5B is a cross-section of the partial IC shown in FIG. 5A being impinged with an energy beam while being annealed with a heat source.

In FIG. 5B, the IC 500 is annealed by a combination of heating IC 500 with heat source 503 while impinging it by energy beam 501. The heat source 503 may be applied from below (as shown) or from all sides as in an oven-type environment (not shown). The energy beam 501 may include any type of appropriate energy such as but not limited to an electron-beam, electromagnetic radiation, radio frequency ("RF"), microwave radiation, millimeter wave radiation, ion-beam, light beam, ultra-violet light or other similar type of energy injection. The energy beam 501 may preferably be directed towards the IC 100 as a plan wave so that the entire surface area of IC 500 is impinged equally with the energy beam 501. The heat source 503 may be operated at a temperature preferably equal to or below 450C (such as below 400C) in order to be compatible with a BEOL process. The intensity of the energy beam 501 is preferably chosen so as to increase (in combination with the heat source 503) the dielectric constant of the cap dielectric layer 112.

FIG. 5B shows the resulting IC 500 structure from annealing the IC 500 with heat source 503 and impinging it with energy beam 501. In FIG. 5B, the cap dielectric layer 112 is partially modified in the areas that are exposed to the energy beam 501. These areas are via area 505, in the via 402, and upper capacitor plate opening area 507 in the upper capacitor plate opening 404. The dielectric values of via area 505 and upper capacitor plate opening area 507 are higher than the dielectric value of the cap dielectric layer 112. The dielectric values of both the via area 505 and upper capacitor plate opening area 507 may be approximately twice as much as the original dielectric value of the cap dielectric layer 112. As an example, if the dielectric layer 112 is $Ta_2O_5$, the original dielectric value is approximately equal to 22. However, after annealing with heat source 503 and impinging with energy beam 501, the dielectric values of via area 507 and upper capacitor plate opening area 507 may be raised to approximately 40. As another example, this annealing and impinging process would typically raise the dielectric constant values of SiN and SiC to approximate values of 7 and 5, respectively.

The next step for fabricating a planar on-chip capacitor includes forming a trench above the via 402 to fabricate an interconnect that serves as a connection to previously fabricated devices or interconnects. This step may include forming additional trenches and may also include such sub-steps as applying, etching, removing and stripping.

Figure 6:
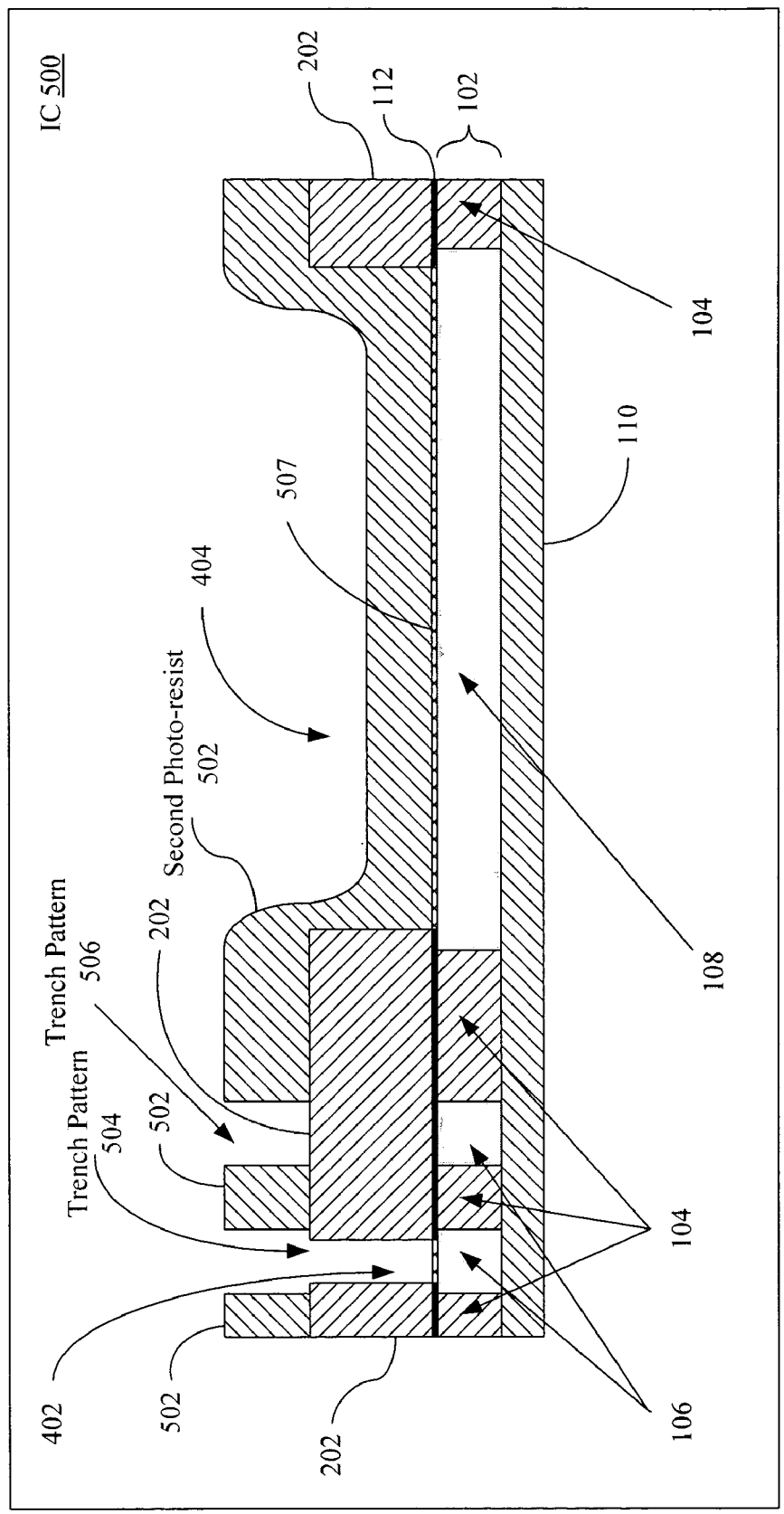
FIG. 6 is a cross-section of the partial IC shown in FIG. 4 after applying a second photo-resist over the structure shown in FIG. 5B to form a trench pattern(s).

FIG. 6 shows the result of the sub-step of applying, on the IC 500, a second photo-resist 502 over the first dielectric layer 202 having the via 402 and upper capacitor plate opening 404 formed within the first dielectric layer 202. The second photo-resist 502 forms a trench pattern 504 above the via 402 and a trench pattern 506 above first dielectric layer 202 as shown in FIG. 6, while the second photo-resist 502 protects the upper capacitor plate opening.

Figure 7:
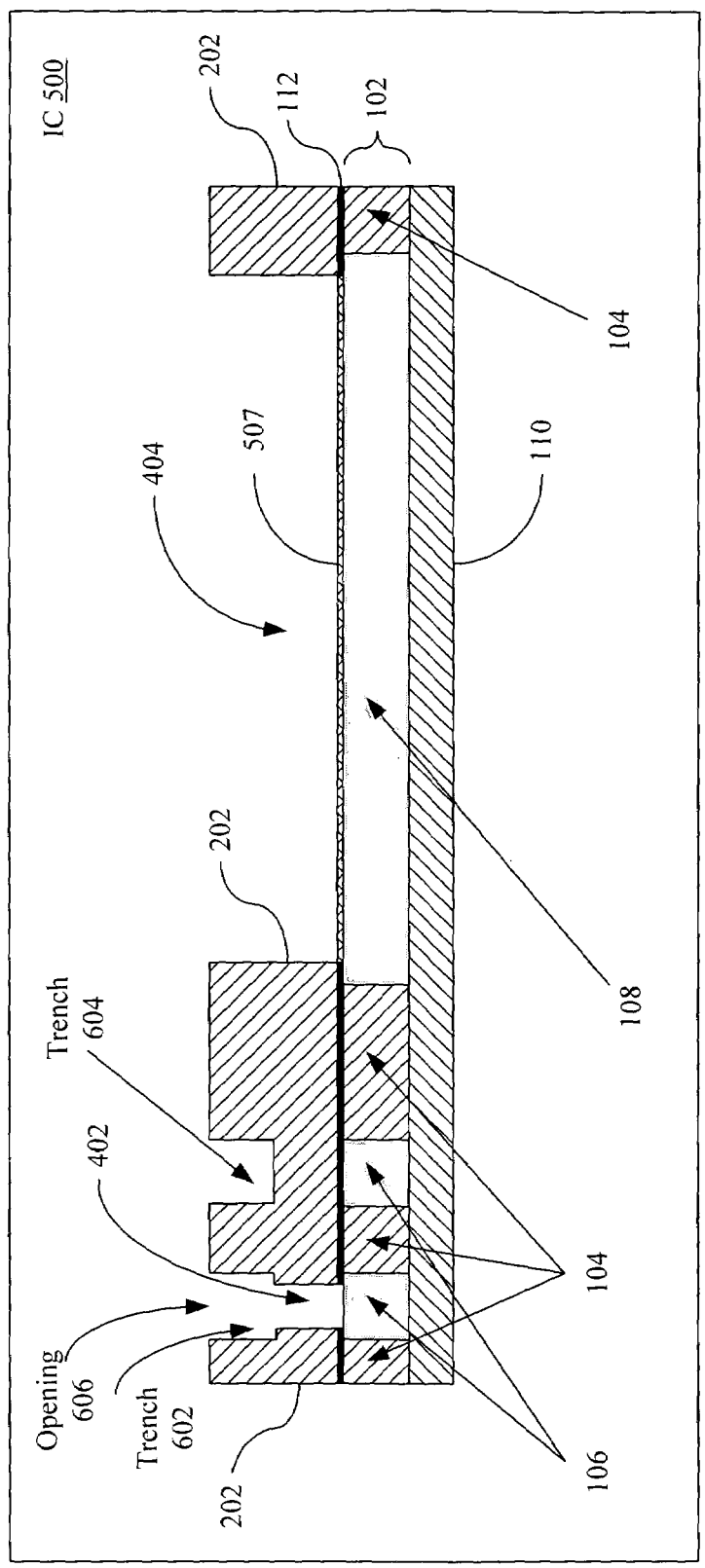
FIG. 7 is a cross-section of the partial IC shown in FIG. 6 after etching the trench in the first dielectric layer after removing the cap dielectric layer from the bottom of the via, after stripping the second photo-resist away.

FIG. 7 shows the sub-step of etching, on IC 500, a trench 602 in the first dielectric layer 202 directly above the via 402 and etching the via 604 in the first dielectric layer 202. FIG. 7 additionally shows the sub-step of removing the cap dielectric layer 505 from the bottom of via 402 (thus forming trench and via opening 606) and trench 604 as shown. The cap dielectric layer 505 may be etched by changing the etching chemistry to selectively etch the dielectric 505. Trench 604 and via opening 606 may be approximately 3 kÅ to 10 kÅ in depth. FIG. 7 shows the sub-step of stripping the second photo-resist 502 from the structure resulting from the applying sub-step.

Figure 8:
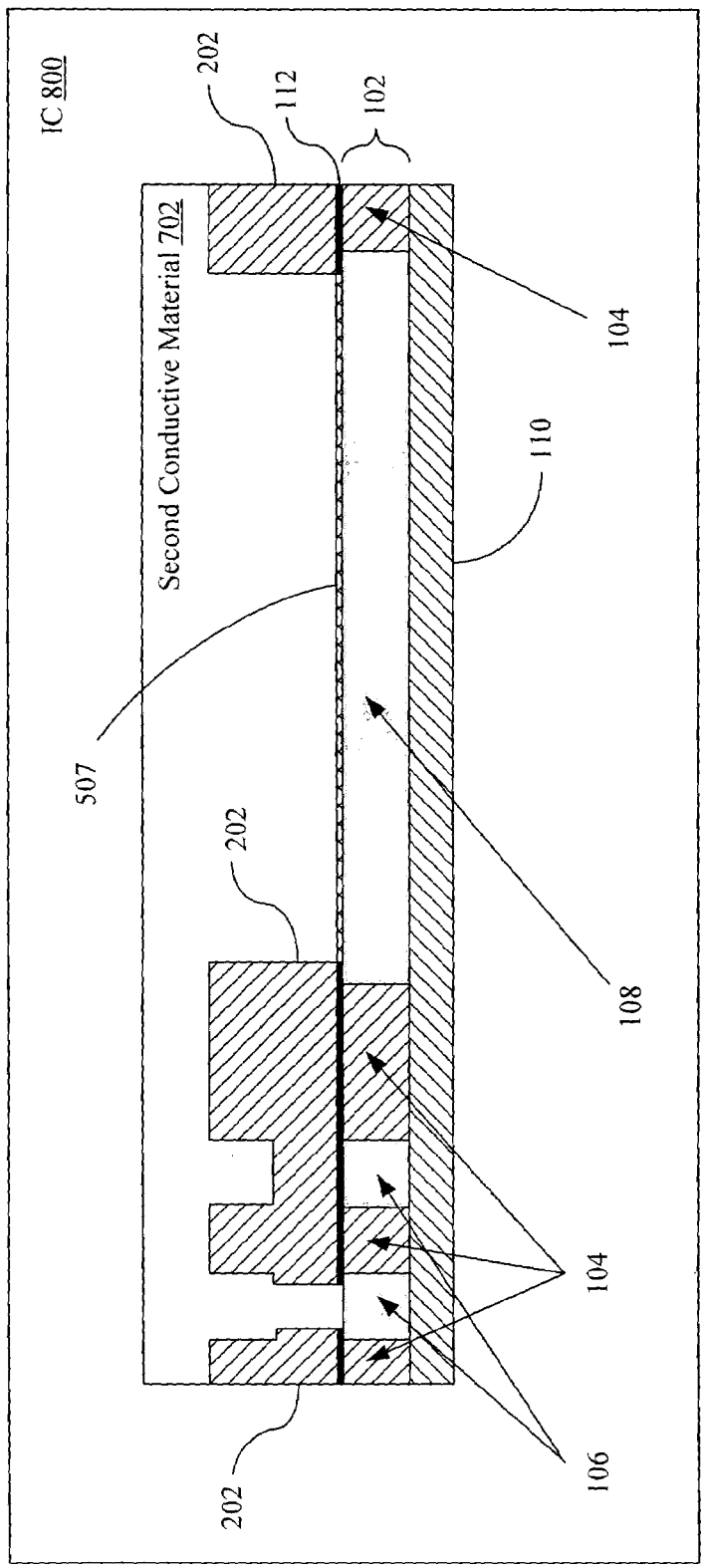
FIG. 8 is a cross-section of the partial IC shown in FIG. 7 after depositing a conductive material layer or conductive material layers such as a metal, a polysilicon, or a compound material to fill the via, the trench, and the upper capacitor plate opening.

FIG. 8 shows the resulting IC 800 from apply the third step in the example method for fabricating a planar on-chip capacitor includes filling the via and trench opening 606, trench 604, and the upper capacitor plate opening 404 with a second conductive material 702. This second conductive material 702 may be a metal, a conductive material and/or a polysilicon material. Examples of the second conductive material 702 include the same as those previously described above with reference to the material utilized to form the lower interconnect 106 and the lower capacitor plate 108. In this example, the second conductive material 702 is metal (or metals) and, although not shown in the drawing, the surface of the metal may mimic the openings for the trenches, via, and upper capacitor plate opening.

It is appreciated that when copper is utilized, the sub-steps include depositing a conductive barrier layer (e.g., Ta, TaN, Ti, TiN, WN, TaSiN, TiSiN, CoWP, etc.), and depositing a copper seed layer followed by copper electroplating. Additionally, the copper barrier and seed layers may be deposited by physical vapor deposition ("PVD"), chemical vapor deposition ("CVD"), and electroplating. The bulk copper may then be deposited by PVD or CVD instead of electroplating.

The last step in the example method for fabricating a planar on-chip capacitor includes employing chemical mechanical planarization ("CMP") to remove excess second conductive material 702. In the actual process of depositing and removing layers on the substrate, the upper surface resembles a non-uniform structure with ridges and valleys. Application of CMP during the manufacture acts to smooth the high spots on the substrate providing a smoother surface allowing multiple layers to be applied to the substrate.

Figure 9:
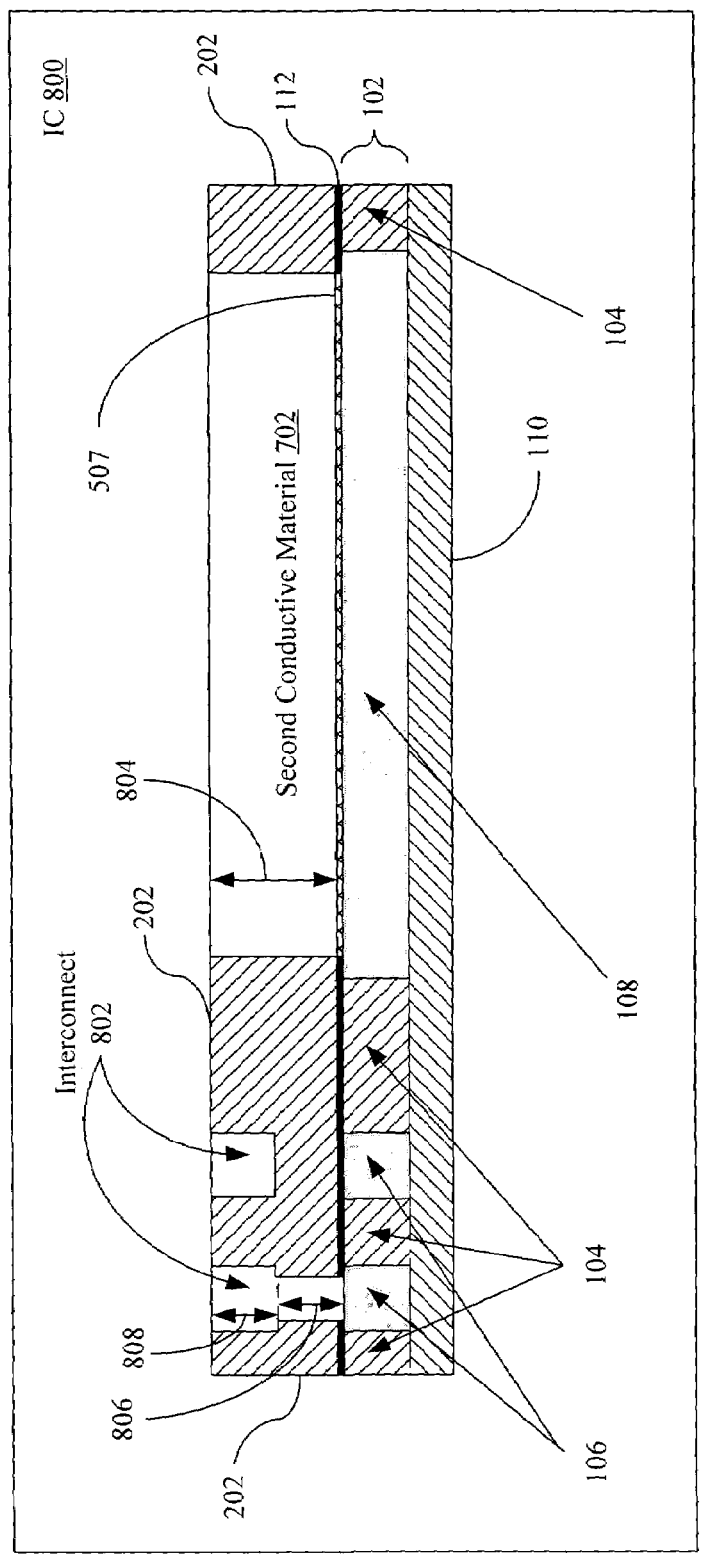
FIG. 9 is a cross-section of the partial IC shown in FIG. 8 after CMP is performed to remove excess material on the surface of the first dielectric layer.

The resulting structure from carrying out this last step is shown in FIG. 9. This figure shows an on-chip capacitor having an upper capacitor plate (also known as a "top electrode") formed from the second conductive material 702, a lower capacitor plate (also known as a "bottom electrode") formed from materials previously described above with reference to reference number 108 in the figures, and an insulator formed from the cap dielectric layer 507 and interconnect 802 formed from the second conductive material 702 by filling via and trench opening 606 and trench 602.

This methodology provides for the simultaneous fabrication of the interconnect and capacitor without additional masks or steps. The resulting structure shown in FIG. 9 may be utilized to process the next level of interconnects and on-chip capacitors and the process may be continually repeated. It is appreciated by those skilled in the art, that this process produces an IC 100 that has a second conductive material 702 thickness 804 in upper capacitor opening 404 that is approximately equal in height to addition of the via 402 height 806 and the trench 602 height 808. As a result, the Q of the capacitor is high because the dielectric value of the cap dielectric 507 is high and the parasitic resistance is low because resistance of the second conductive material 702 is low.

An optional step of depositing a dielectric cap layer over the surface of the structure after the step of employing CMP may also be performed. If aluminum ("Al") or Tungsten ("W") is employed, the cap may be optional because typically a barrier layer is not need to encapsulate the interconnect as is generally done in a copper process.

As mentioned above, optional steps including 1) the step of forming an etch stop layer within the first dielectric layer to aid in forming the trench and via and 2) the step of depositing a metal barrier layer prior to depositing the metal (copper) layer to fill the vias, trench and upper capacitor plate opening when simultaneously forming and interconnect and capacitor, may also be included in the first example method. This structure may then be employed to continue to process the next level of interconnects and on-chip capacitors.

Those steps that include the deposition of a metal, a dielectric, and the formation of a photo-resist pattern may be accomplished by any of the typical approaches known to those of skill in the art within the semiconductor industry. For example, the process of depositing a material may include, but is not limited to, CVD, PVD, electroplating, spin-on deposition ("SOD").

FIGS. 10–21 show a second example method for fabricating planar on-chip capacitors having high precision, good matching, low parasitics, high Q, and high density at low cost. Similar to the previously described first example method, this second process begins with a semiconductor wafer substrate that contains previously fabricated devices and/or interconnect structures. On top of the substrate, there is a material layer having conductive regions separated by insulation regions and the material layer is covered by a cap layer.

Figure 10:
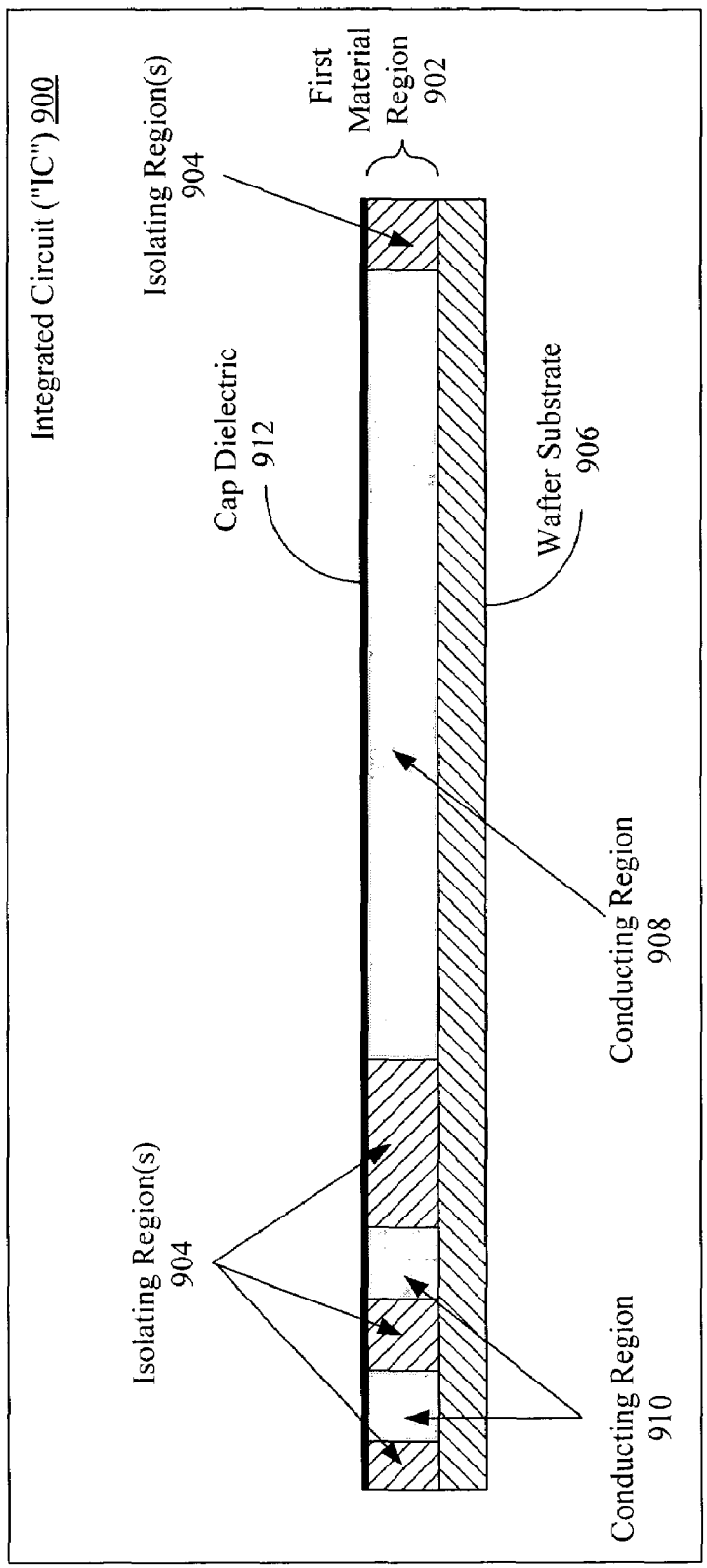
FIG. 10 is a cross-section of part of an IC having a first material layer that includes a conductive material on a substrate where the conductive material regions are separated by insulating material regions, and a cap dielectric layer deposited over the conductive and the insulating materials.

FIG. 10 depicts a partial cross-section of and IC 900 formed with known processing having a first material layer 902 including an insulating region 904 such as a dielectric over a wafer substrate 906. The insulating region 904 may be formed with silicon, where the insulating region(s) isolates conductive region(s) 908 and 910 and where some of the conductive regions serve as a lower capacitor plate 908. These conductive regions 908 and 910 may be filled with a metal (such as copper and its barrier layer or other similar conductive metal), a polysilicon, or a diffusion area on a silicon substrate. A cap dielectric layer 912 is deposited over the material layer 902. Examples of the dielectric layer 904 and the cap dielectric layer 912 include the same materials listed in reference to the dielectric layer 104 and the cap dielectric layer 112 in FIG. 2. In addition, examples of the material utilized to form the lower capacitor plate 908 may be a metal, polysilicon, or diffusion area on a silicon substrate such as those previously described with reference to the lower capacitor plate 110 shown in FIG. 2. However, for ease in describing the second example method, copper will be employed as the material for forming the lower capacitor plate 908 and lower interconnect 910, where cap layer 912 serves as a diffusion barrier for copper. It is appreciated by those skilled in the art that other similar metals also may be utilized.

Figure 11:
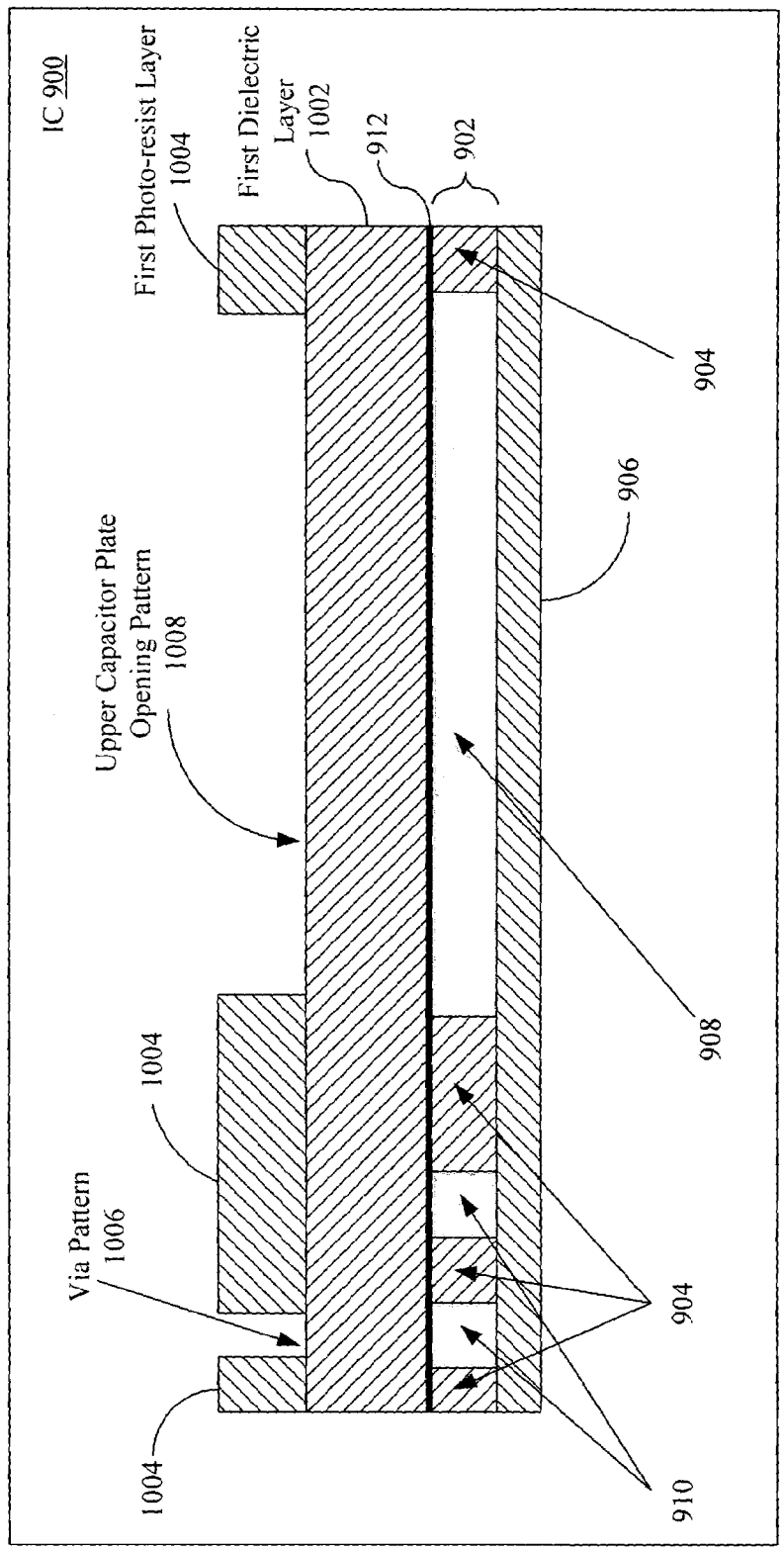
FIG. 11 is a cross-section of the partial IC shown in FIG. 10 after depositing a first dielectric layer over the IC shown in FIG. 10 and applying a first photo-resist over the first dielectric layer to form a pattern for a via and an upper capacitor plate opening.
Figure 12:
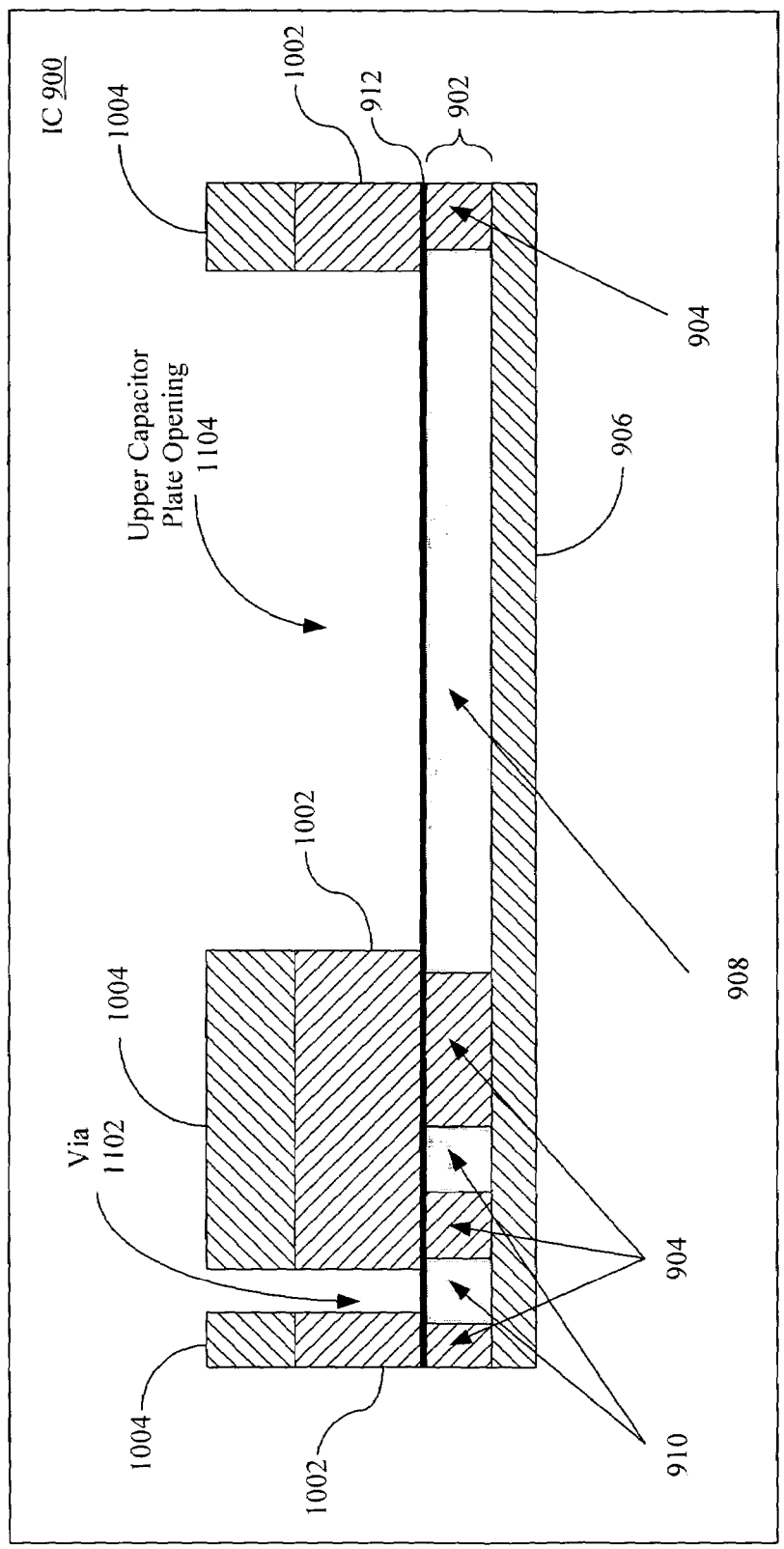
FIG. 12 is a cross-section of the partial IC shown in FIG. 11 after etching the via and upper capacitor plate opening into the first dielectric layer.
Figure 13:
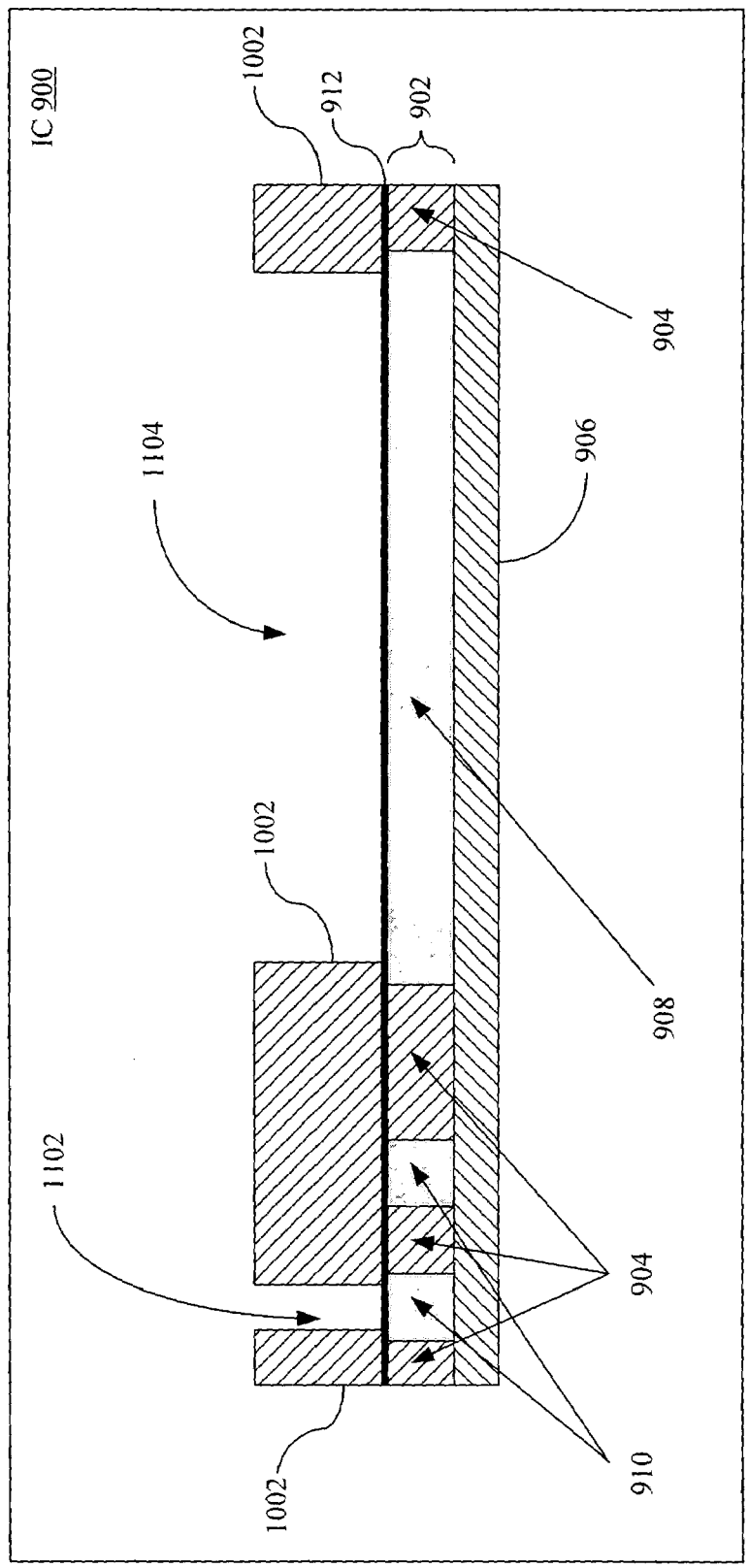
FIG. 13 is a cross-section of the partial IC shown in FIG. 12 after stripping away the first photo-resist.

In a first step of the second example method for fabricating a planar on-chip capacitor, at least one via and at least one opening for an upper capacitor plate are simultaneously formed in a first dielectric material that is deposited on the surface of the structure shown in FIG. 11. This step of simultaneously forming a via and upper capacitor opening includes the steps of (i) depositing a first dielectric layer 1002 over the cap dielectric layer 912 shown in FIG. 11, (ii) applying a first photo-resist layer 1004 over the first dielectric layer 1002 to form a via pattern 1006 and an upper capacitor plate opening pattern 1008 as shown in FIG. 11, (iii) etching the via 1102 and upper capacitor plate opening 1104 in the first dielectric layer 1002 as shown in FIG. 12, and (iv) stripping the first photo-resist layer 1004 on the first dielectric layer 1002 as shown in FIG. 13. In this example method, a selective etch may utilize an etch chemistry that is selective to cap dielectric layer 912. In this way, the etch chemistry will etch away first dielectric layer 1002 and stop at cap dielectric layer 912.

Figure 14A:
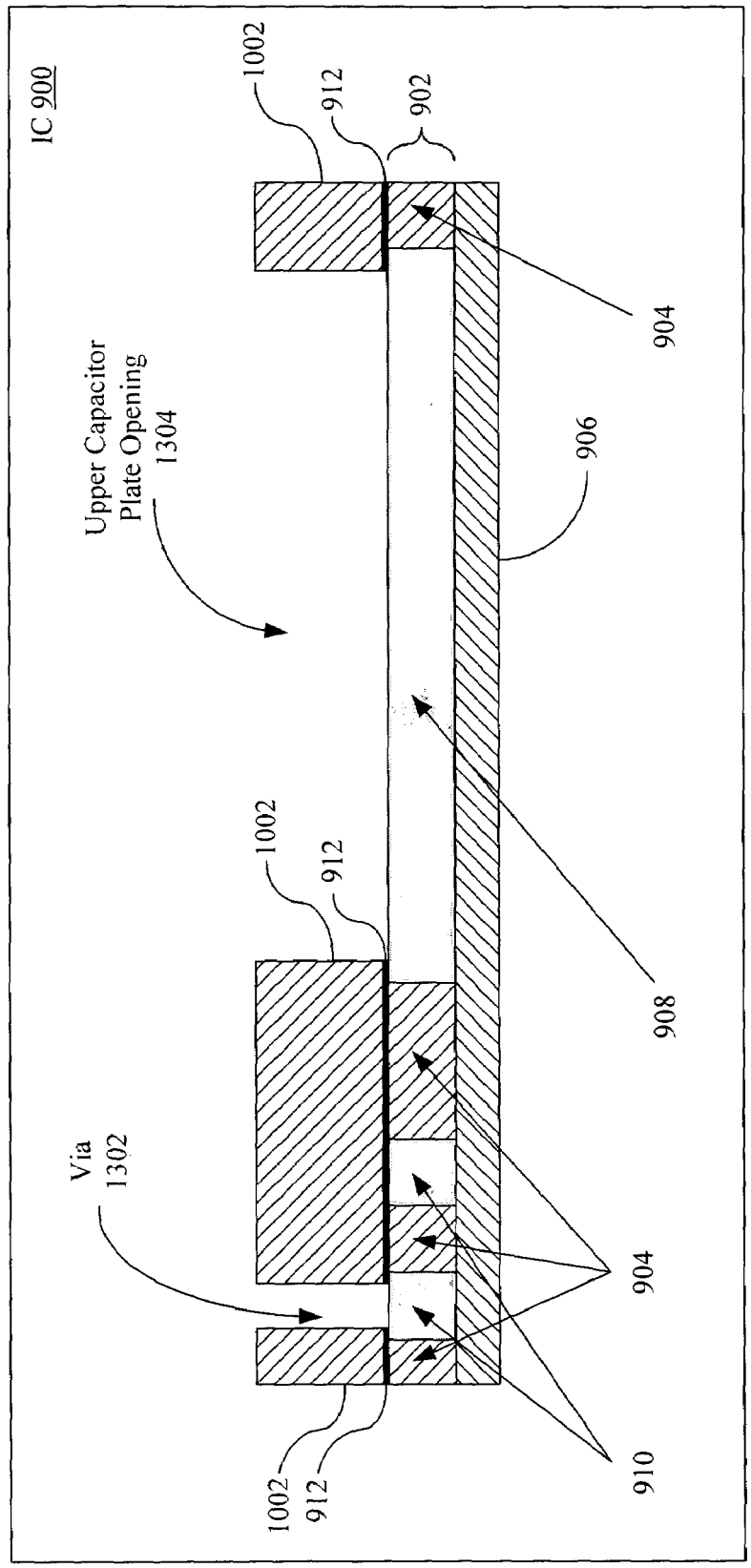
FIG. 14A is a cross-section of the partial IC shown in FIG. 13 after removing the cap dielectric layer from the bottom of the via and upper capacitor plate opening.

The first cap dielectric layer 912 is then removed from the bottom of the via 1302 and the bottom of the upper capacitor plate opening 1304 in step two to expose the copper layer 910 as shown in FIG. 14A. A selective etch may utilize an etch chemistry that etches away cap dielectric layer 912 at the bottom of via 1302 and upper capacitor plate opening 1304 without etching the first dielectric layer 1002.

Figure 14B:
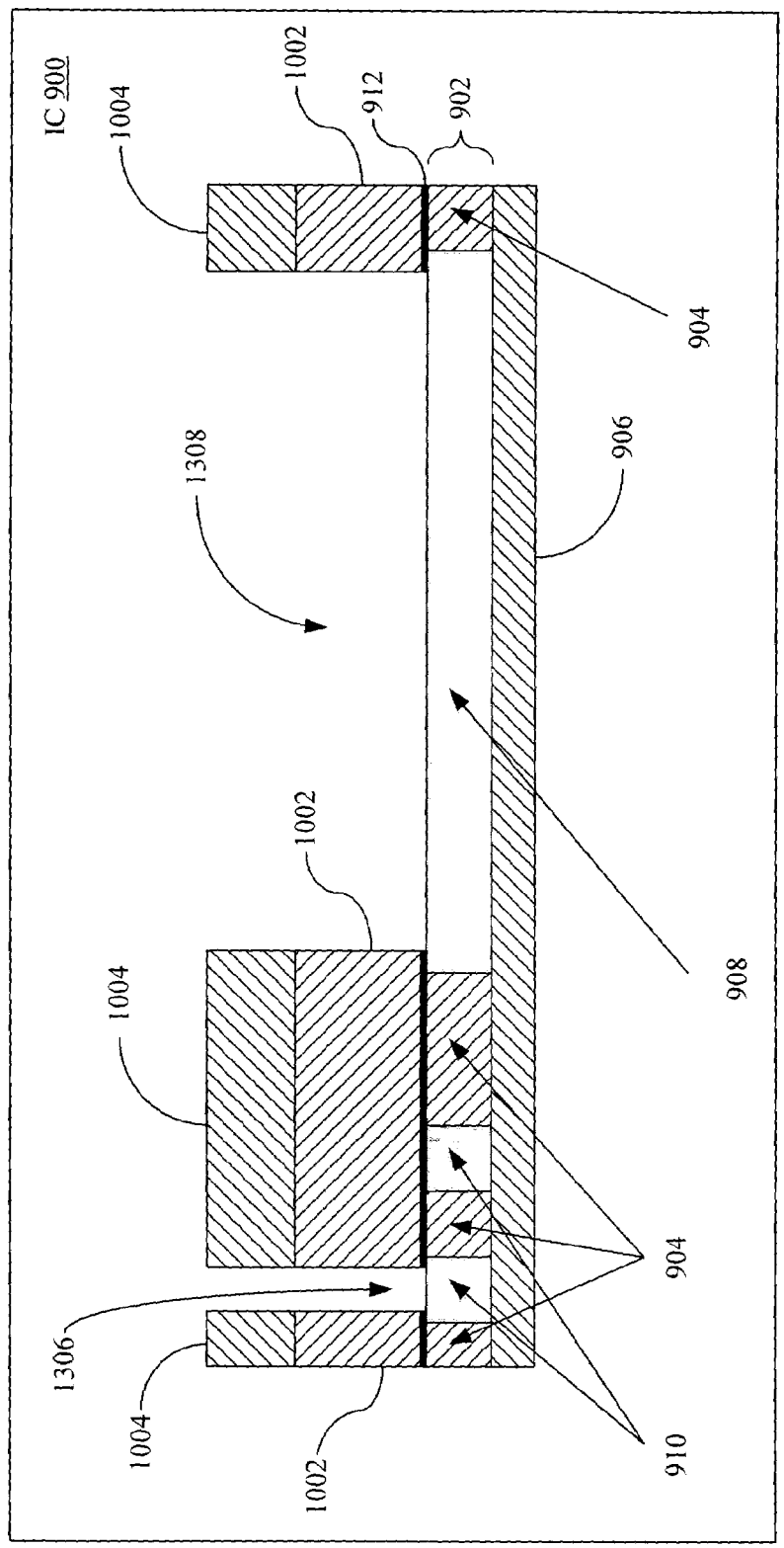
FIG. 14B is a cross-section of the partial IC shown in FIG. 11 after removing the cap dielectric layer from the bottom of the via and upper capacitor plate opening.
Figure 14C:
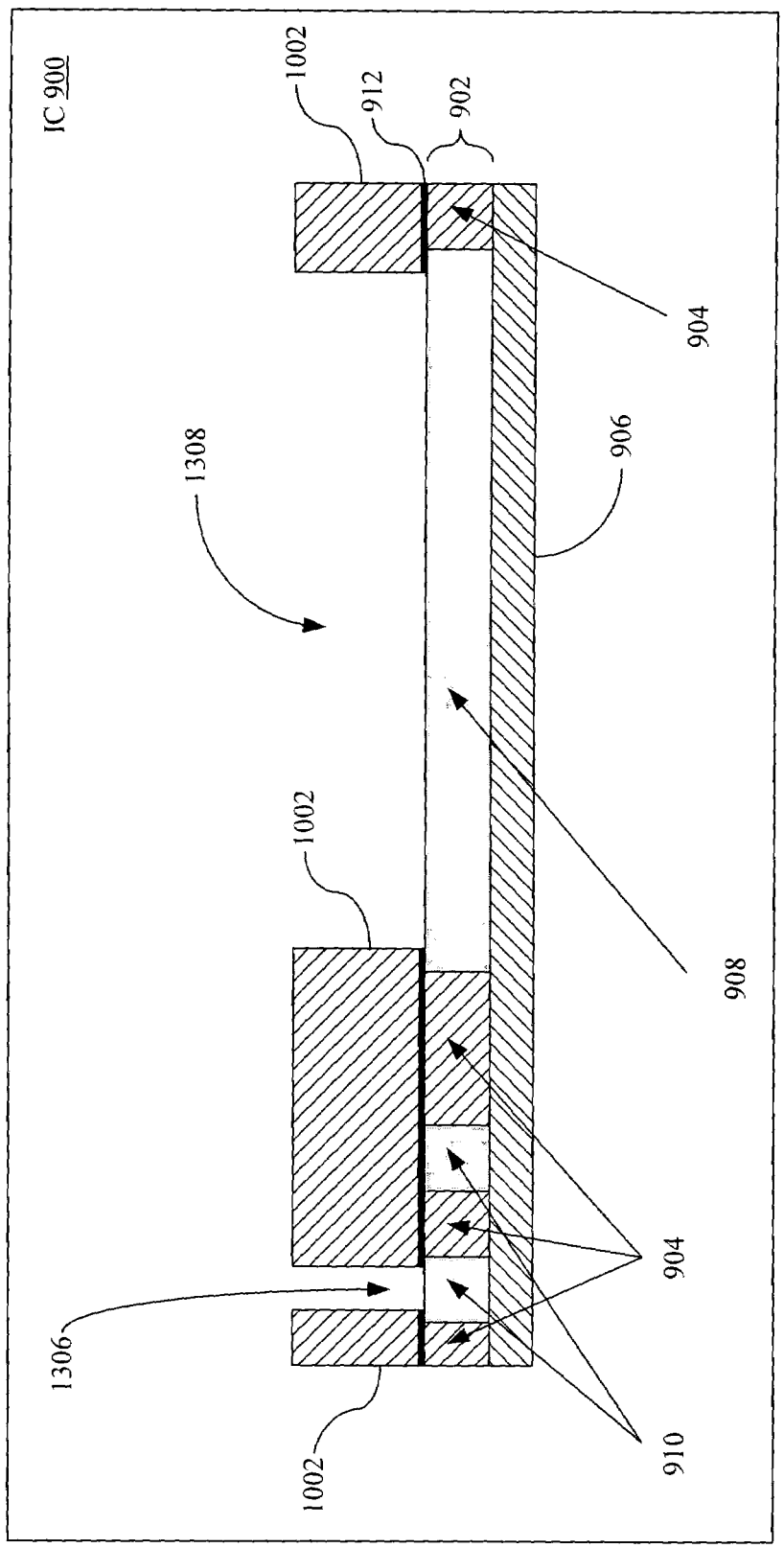
FIG. 14C is a cross-section of the partial IC shown in FIG. 13 after stripping away the first photo-resist.

Alternatively, in FIG. 14B, a variation of the above described example method is shown that may include etching the cap dielectric layer 912 from the bottom of via 1306 and upper capacitor plate opening 1308 resulting in the structure shown in FIG. 14C. In FIG. 14B, the etch will etch away both the first dielectric layer 1002 and the cap dielectric layer 912 but not the conductive material 908 and 910.

Figure 15:
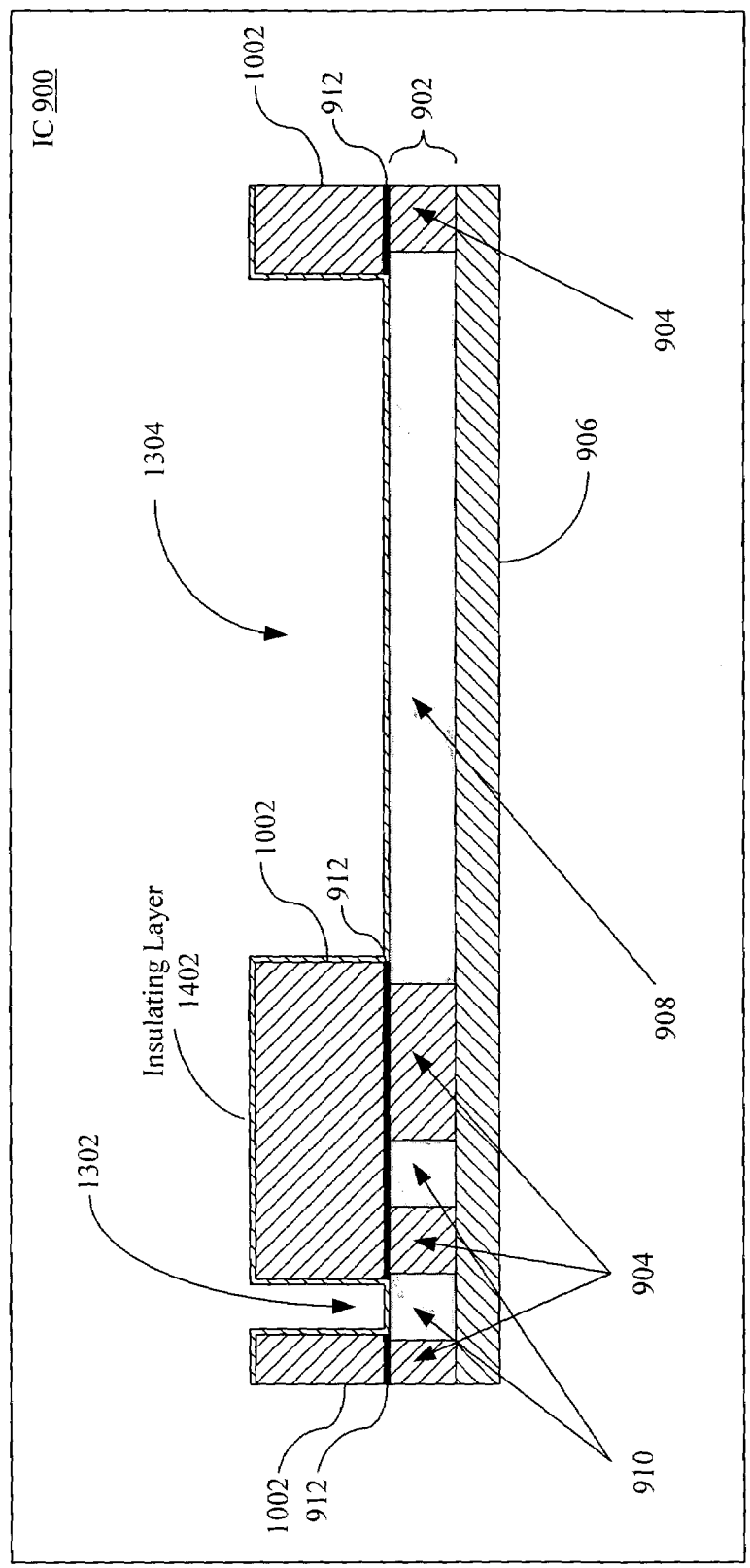
FIG. 15 is a cross-section of the partial IC shown in FIG. 14A or FIG. 14C after depositing a capacitance dielectric layer over the first dielectric layer into the via and the upper capacitor plate opening.
Figure 16:
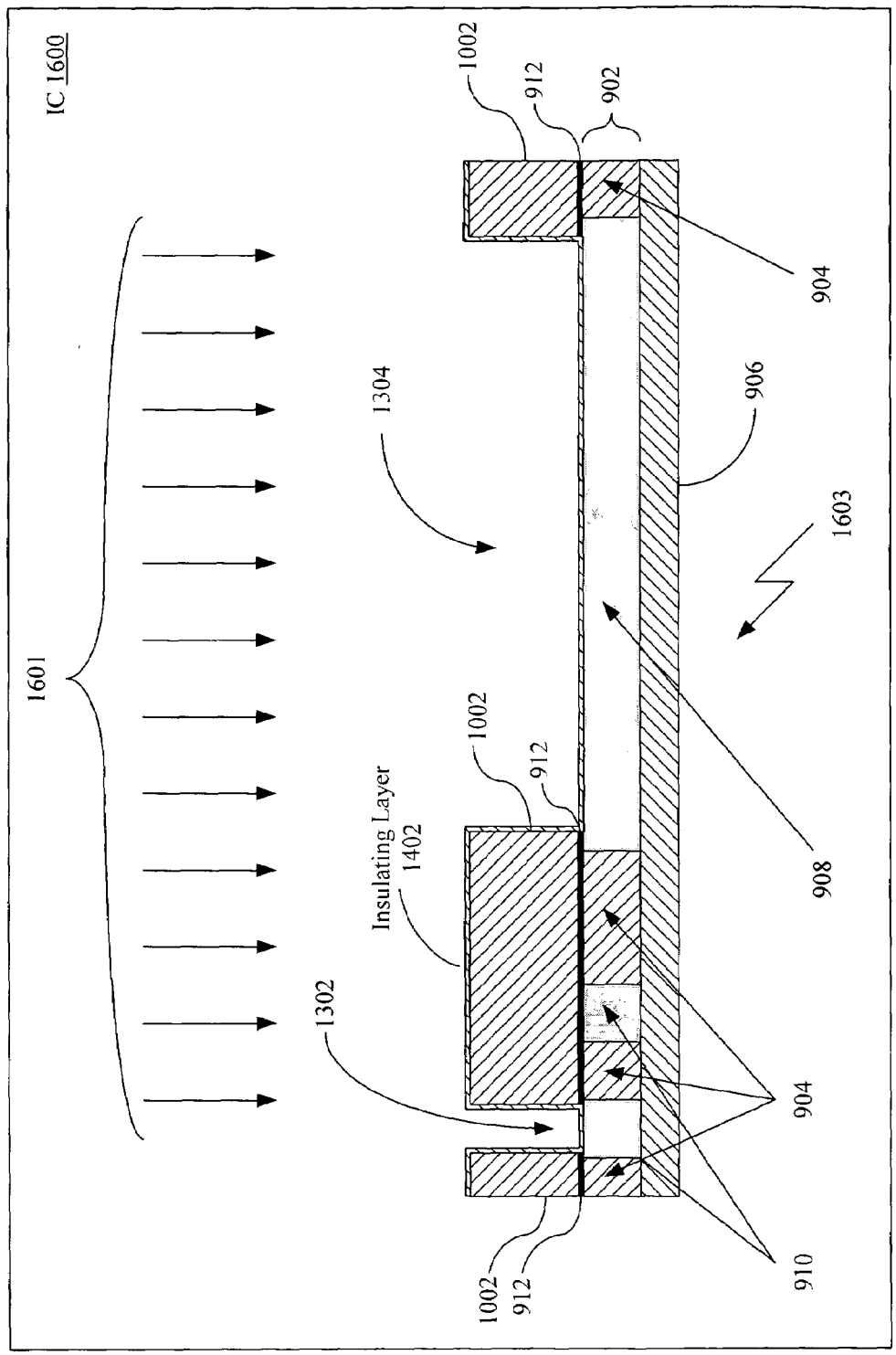
FIG. 16 is a cross-section of the partial IC shown in FIG. 15 being impinged with an energy beam while being annealed with heat source.
Figure 17:
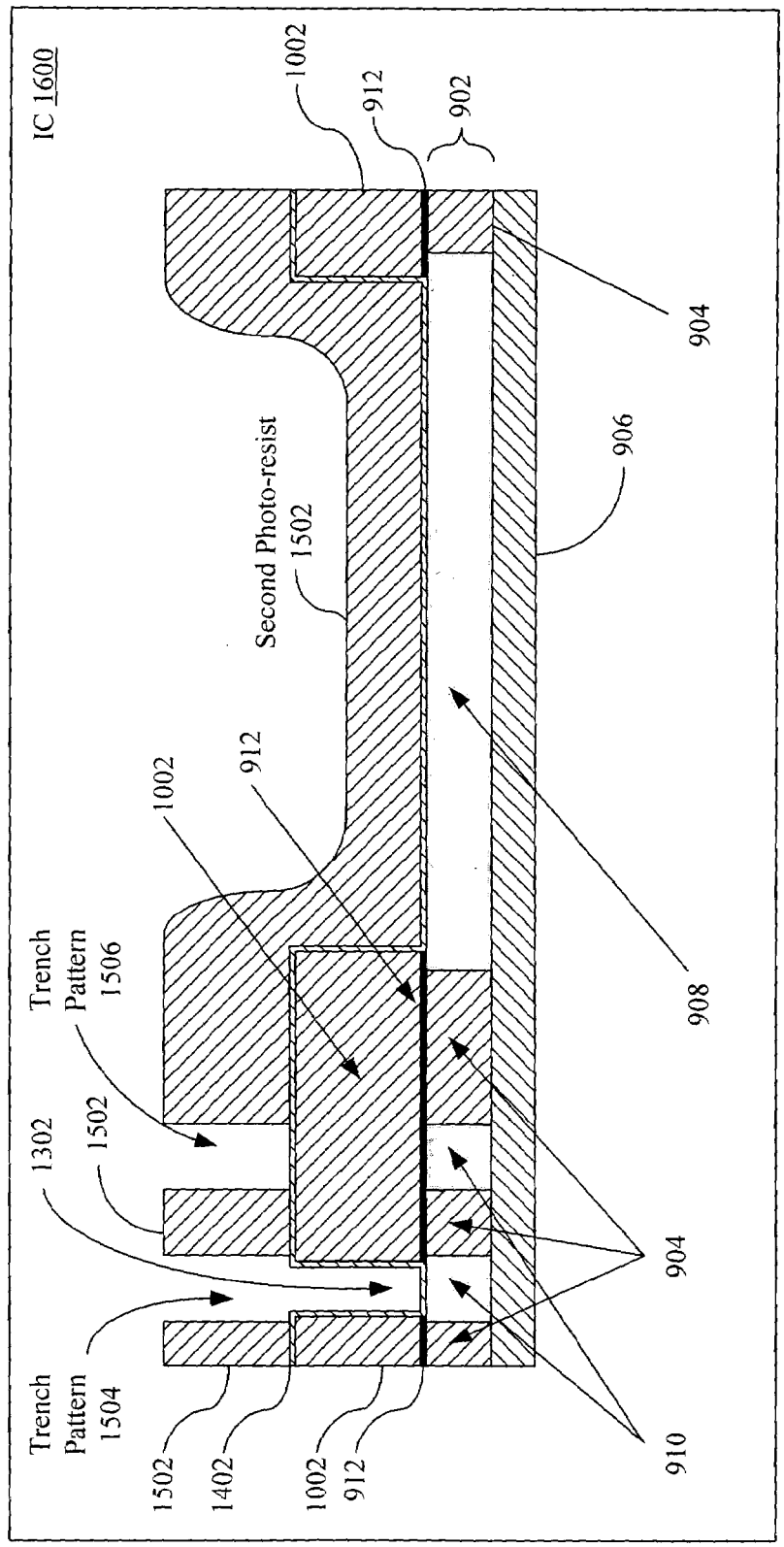
FIG. 17 is a cross-section of the partial IC shown in FIG. 16 after applying a second photo-resist over the capacitance dielectric layer to form a via pattern and a trench pattern above the via while protecting the upper capacitor plate opening.
Figure 18:
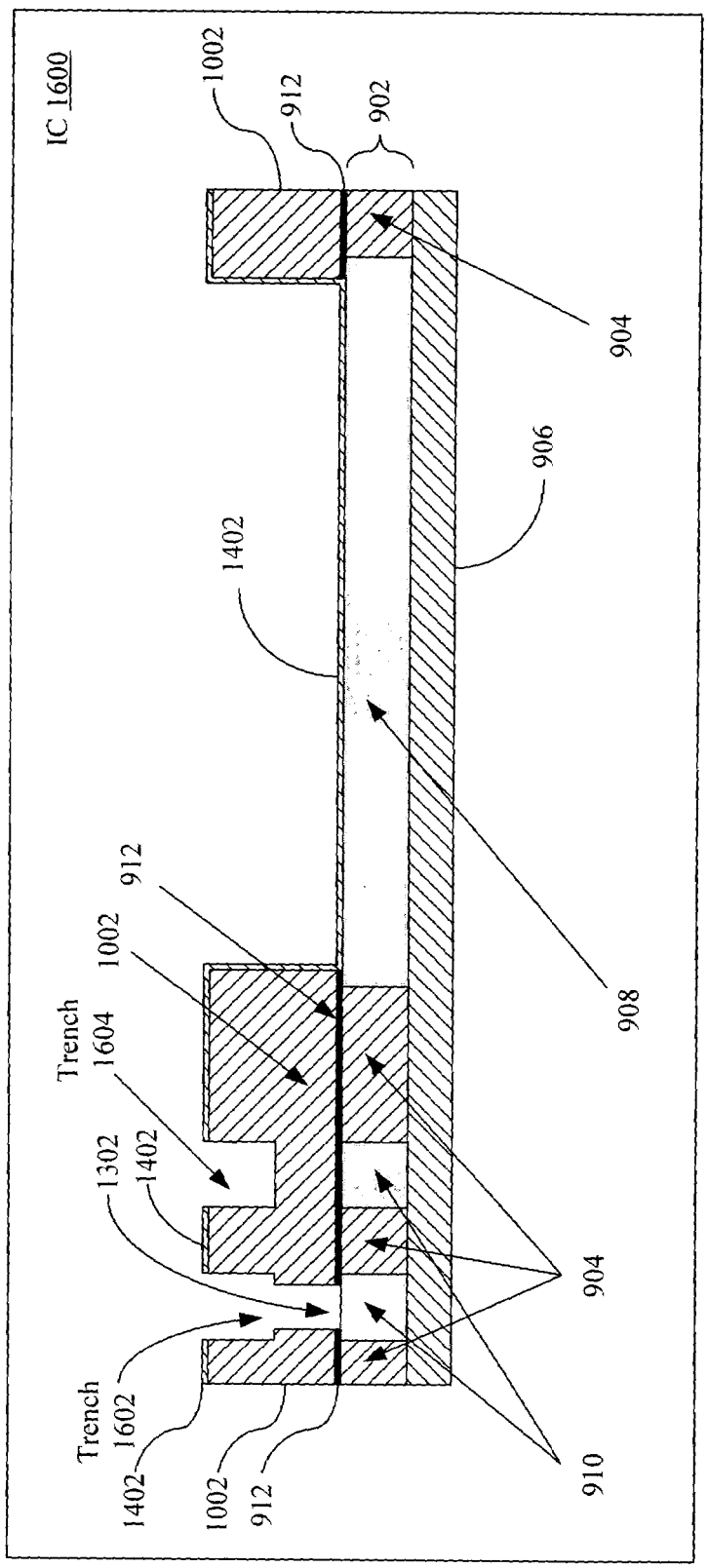
FIG. 18 is a cross-section of the partial IC shown in FIG. 17 after etching the via and the trench in the capacitance dielectric and first dielectric layers and removing the capacitance dielectric from the bottom of the vias after stripping away the second photo-resist.

Next, a trench is formed above the via 1302 in step three. The step of forming a trench above the via 1302 may include forming additional trenches and includes the following steps: (a) depositing an insulating layer (capacitance dielectric) 1402 over the first dielectric layer 1002 and via and copper capacitor openings such that it covers the bottom of the via 1302 and the bottom of the first capacitor plate opening 1304 as shown in FIG. 15, (b) impinging the IC 900 with energy beam 1601 while heating to anneal the IC 900 with heat source 1603 at a temperature preferably equal to or below 450C (such as below 400C), as shown in FIG. 16, (c) applying a second photo-resist 1502 over the insulating layer 1402 to form a trench pattern 1504 above the via 1302 and a trench pattern 1506 as shown in FIG. 17 while the second photo-resist 1502 protects the upper capacitor plate opening, (d) etching the trenches 1602 and 1604 in the insulating layer 1402 and the first dielectric layer 1002 and removing the insulating layer 1402 from a bottom of via 1302 and (d) stripping the second photo-resist 1502 from the structure resulting from etching the trenches in step (c) to arrive at the structure shown in FIG. 18.

The insulating layer 1402 may include a dielectric such as $SiO_2$, $SiN$, $Al_2O_3$, $SiC$, $HfO_2$, $HfON$, $HfSiON$, $ZrO_2$, $ZrO_2$, etc., or any other similar material that may be suitable for functioning as an insulator in an on-chip capacitor. The photo-resist for those steps that require a photo-resist may include material commercially available that is well know to those skilled in the art such as photo-resist 202, FIG. 3.

Figure 19:
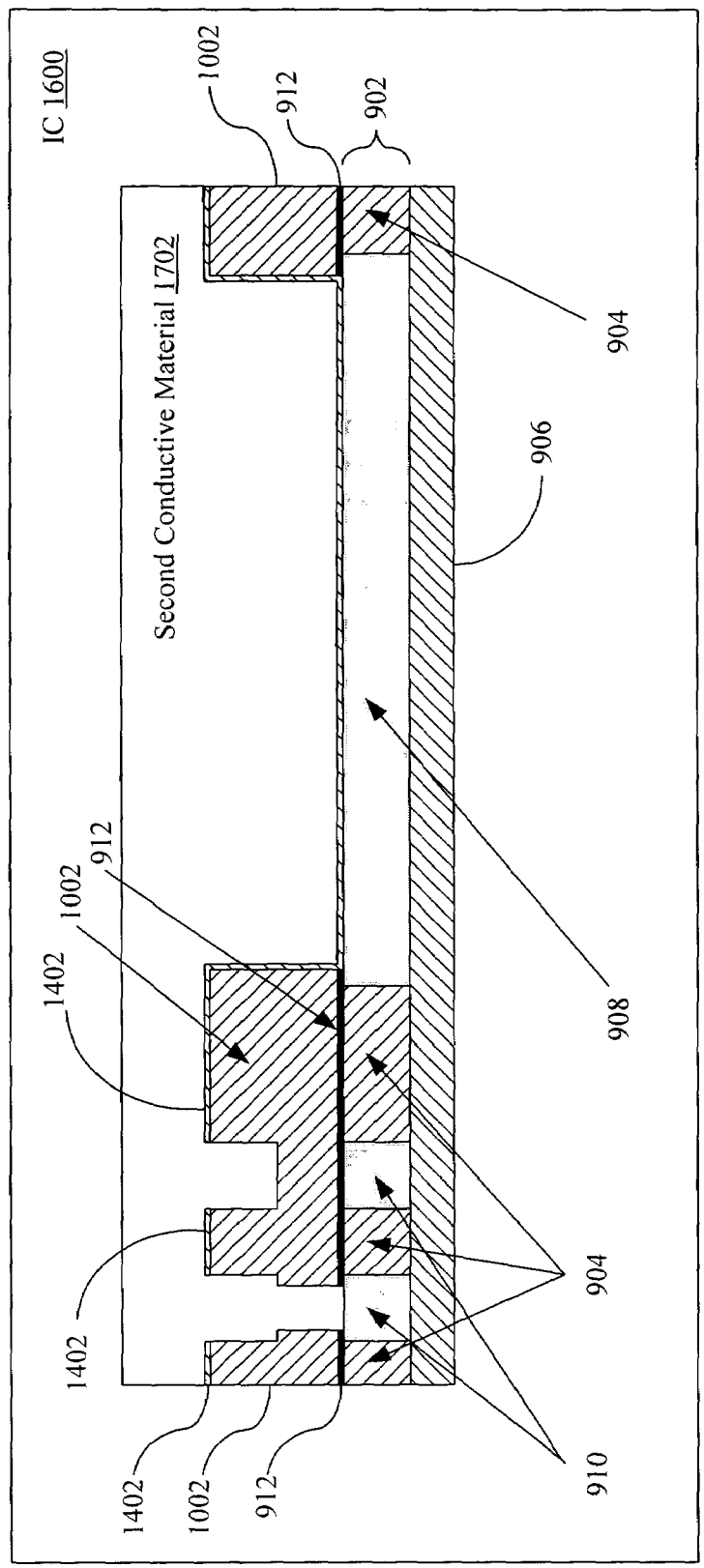
FIG. 19 is a cross-section of the partial IC shown in FIG. 18 after filling the via, the trench, and upper capacitor plate opening with a conductive material such as copper.

A second conductive material layer 1702 that, depending upon the type of capacitor being configured, may include a metal, such as copper and its barrier layer, aluminum or tungsten for example, a polysilicon, is then deposited over the structure resulting after step three in step four so that the second conductive material layer 1702 fills the via 1302, the trenches 1602 and 1604, and the upper capacitor plate opening 1304 as shown in FIG. 19. For purposes of explaining the final steps of fabricating a planar on-chip capacitor in accordance with the second example method, copper and its barrier layer may be utilized as the second conductive material layer 1702, where the copper and its barrier layer may be deposited by the earlier described techniques.

Figure 20:
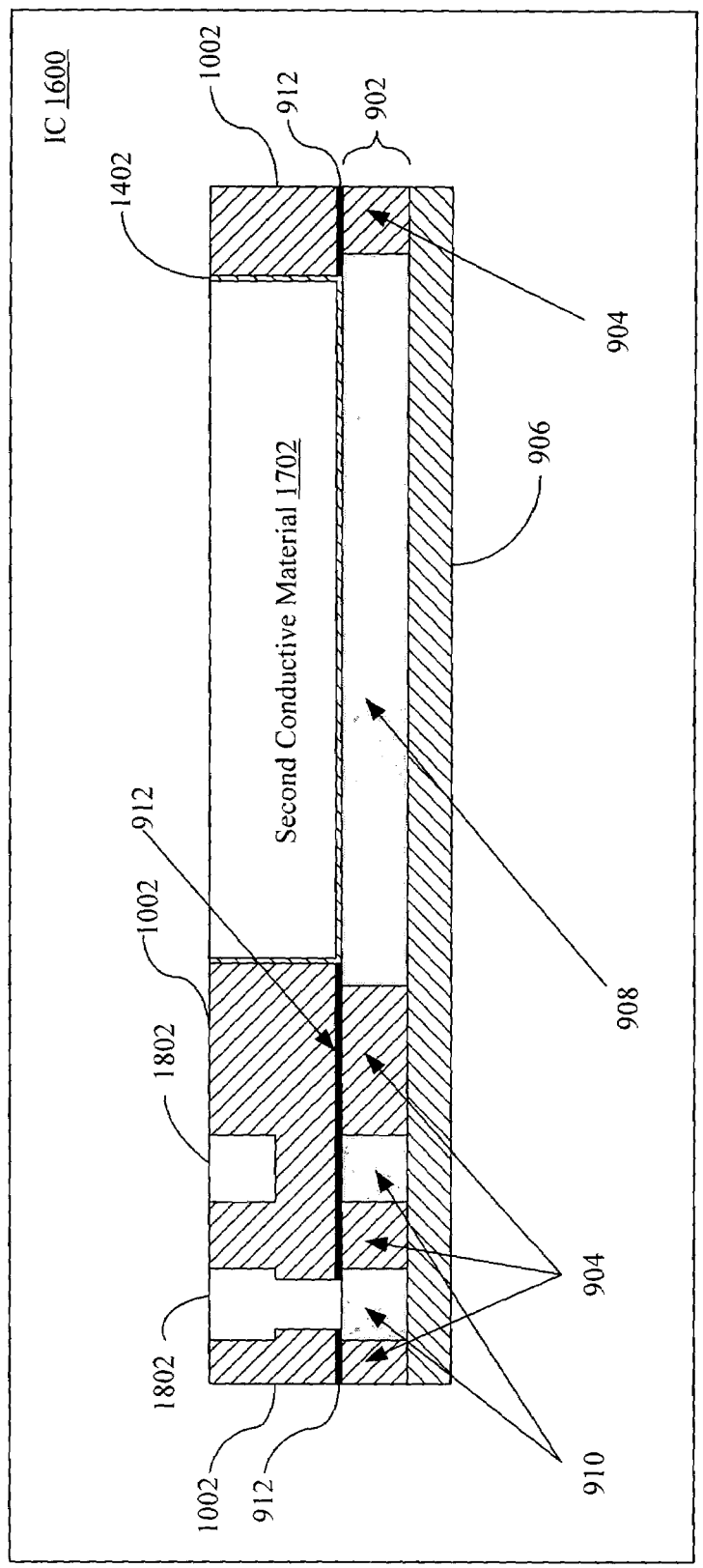
FIG. 20 is a cross-section of the partial IC shown in FIG. 19 after employing CMP to remove excess conductive material from the wafer surface.

The last step in fabricating a planar on-chip capacitor in accordance with the second example method may includes employing CMP to remove excess copper 1702 from the structure that results from carrying out the fourth step in fabricating the planar on-chip capacitor described above. In addition, the excess capacitance (or capacitor) dielectric layer 1402 may be removed by CMP from the wafer surface. The resulting structure from carrying out this last step is shown in FIG. 20 that shows a planar on-chip metal-insulator-metal ("MIM") capacitor having an upper capacitor plate (also known as a "top electrode") formed from copper layer 1702, a lower capacitor plate (also known as a "bottom electrode") formed from copper layer 908. FIG. 20 also shows interconnects 1802. It is appreciated by those skilled in the art, that second conductive material layer 1702 is instead chosen to be a silicon substrate, the planar on-chip capacitor would be a metal-insulator-silicon ("MIS") capacitor. If both the conducting region 108 and the second conductive material layer 1702 is chosen as polysilicon, the planar on-chip capacitor would be polysilicon-insulator-polysilicon ("PIP") capacitor. Additionally, if the conducting region 108 includes a polysilicon and the second conductive material layer 1702 includes a silicon substrate, the planar on-chip capacitor would be a polysilicon-insulator-silicon ("PIS") capacitor.

Figure 21:
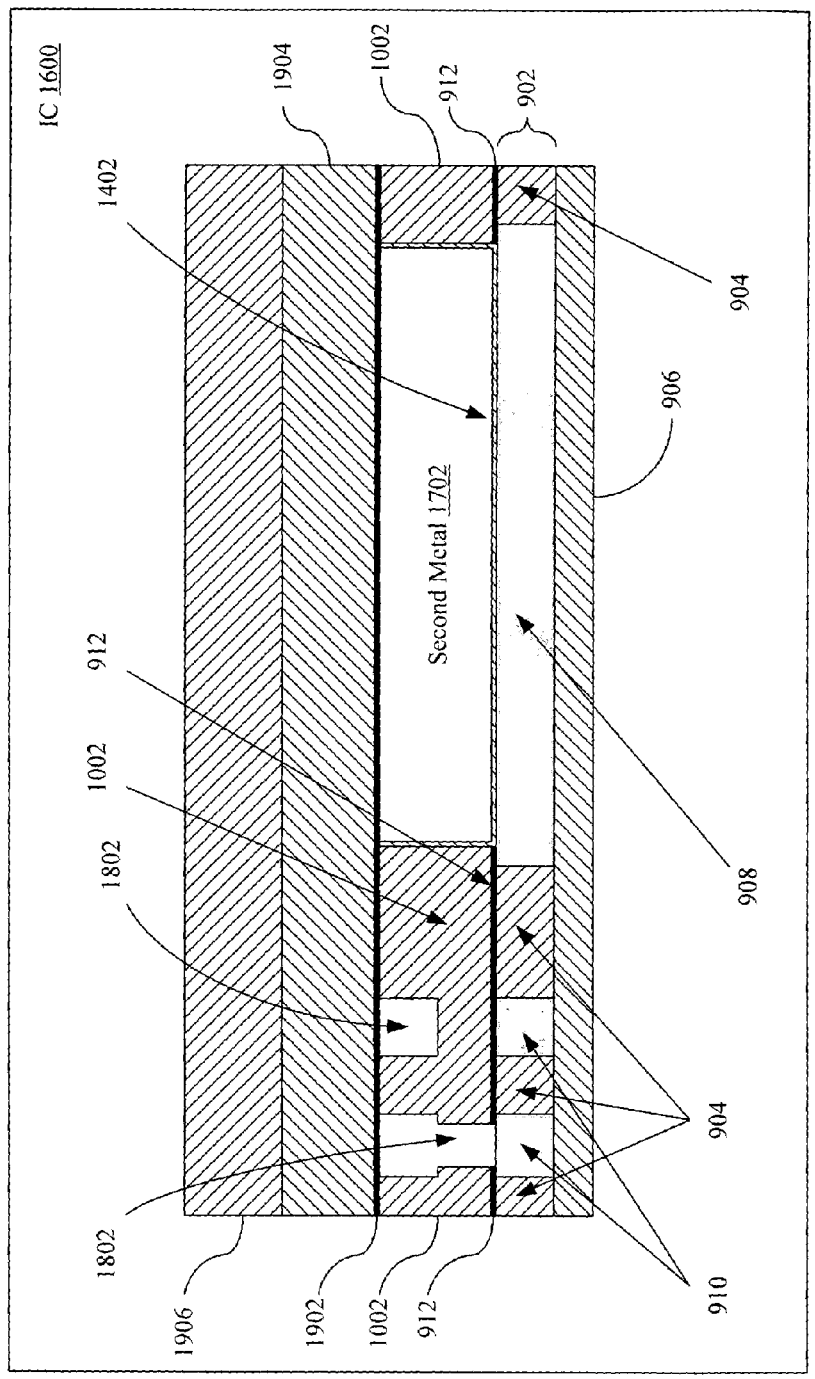
FIG. 21 is a cross-section of the partial IC shown in FIG. 20 after depositing a dielectric barrier layer over the IC shown in FIG. 20.

Similar to the first example method for forming an on-chip capacitor, an optional step of depositing a dielectric cap layer 1902 over the surface of the structure resulting after the step of employing CMP, as shown in FIG. 21, may also be performed as part of the second example method of forming a planar on-chip capacitor. However, if aluminum or tungsten is employed, the cap may be optional because typically a barrier layer is not need to encapsulate the interconnect as is generally done in a copper process. Also, similar to the first example method, additional optional steps including 1) the step of performing an etch stop within the first dielectric layer to aid in forming the trench and via and 2) the step of depositing a metal barrier layer prior to depositing the copper layer to fill the vias, the trench, and the upper capacitor plate opening may also be included. Finally, in FIG. 21, a $SiO_2$ 1904 and/or $SiN$ 1906 may be added as a passivation and protection layer (also known as a packaging layer) before the IC processing is finished.

Figure 22:
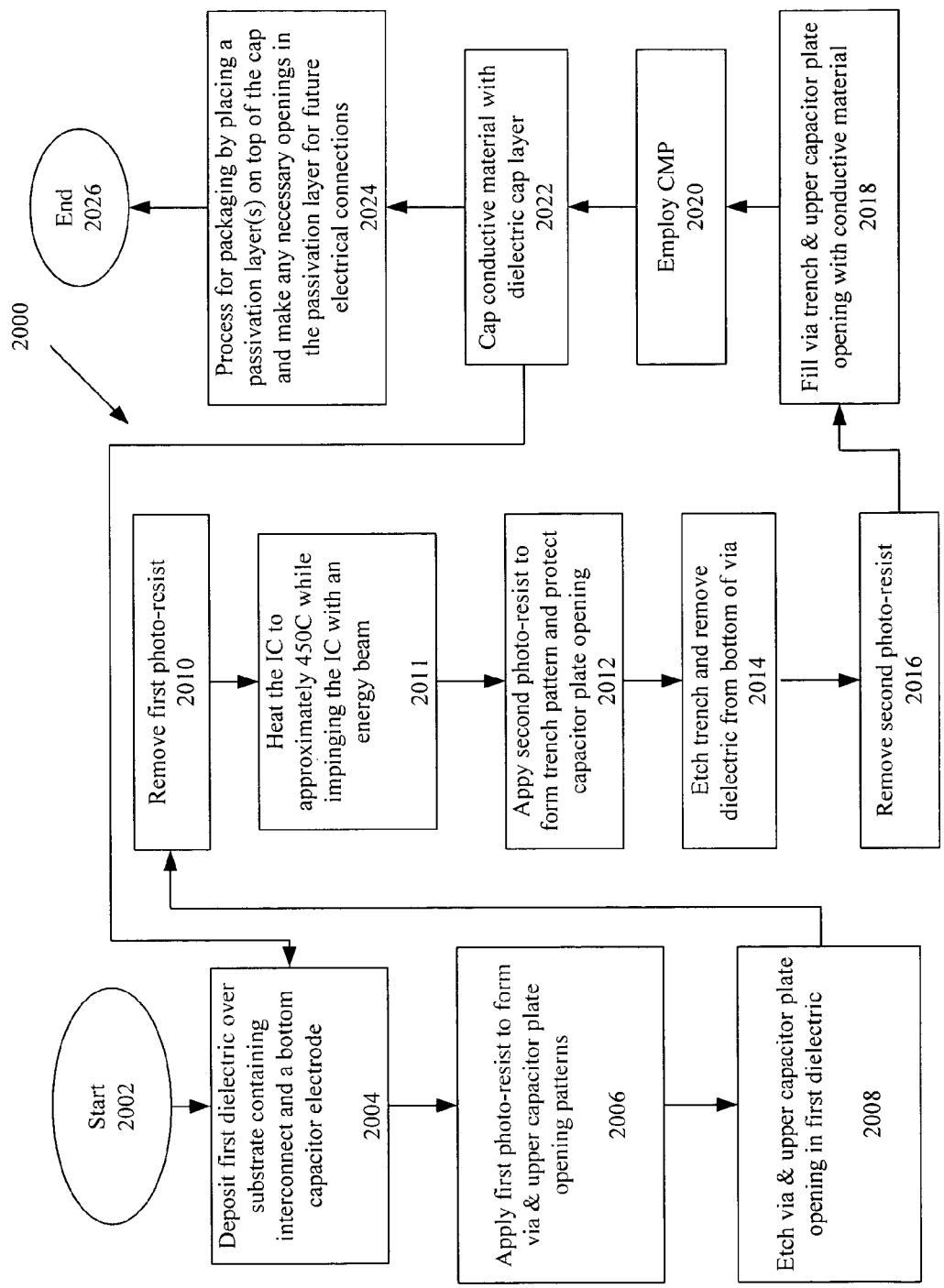
FIG. 22 is a flow chart setting forth one exemplary embodiment of the method of the invention for fabricating planar on-chip capacitors.

FIG. 22 shows a flowchart setting forth the first example method 2000 for fabricating planar on-chip capacitors. The process first starts at step 2002 and then a first dielectric layer is deposited over a starting substrate that contains previously fabricated devices and/or interconnects at step 2004 such as the substrate containing interconnect and a bottom capacitor electrode. On top of the substrate, there is a material layer comprising conductive regions separated by insulation regions and the material layer is covered by a dielectric cap layer. A first photo-resist is then applied at step 2006 to form patterns for a via and an upper capacitor plate opening. The via and upper capacitor plate opening are then etched at step 2008 into the first dielectric layer. The first photo-resist is removed at step 2010 and the IC is heated (annealed) to preferably approximately equal to or less than 450C (such as below 400C) and impinged with an energy beam in step 2011. A second photo-resist is applied at step 2012 to form a trench pattern. This second photo-resist also functions to protect the upper capacitor plate opening. The trench pattern is then etched into the first dielectric material and the dielectric cap layer is removed from the bottom of the via at step 2014. The second photo-resist is then removed at step 2016 and the via, the trenches, and the upper capacitor plate opening are filled at step 2018 with conductive materials such as a metal or other similar conductive materials. CMP is then employed at step 2020 to remove excess conductive material from the wafer surface. Finally, a dielectric cap layer is placed on top of the structure to cap the conductive material in step 2022. This entire process may then be repeated by returning to step 2004 to continue processing the next level interconnect and on-chip capacitor. When all desired levels are fabricated, the IC may be processed for packaging, in step 2024, by placing a passivation layer(s) on top of the cap and make any necessary openings in the passivation layer for future electrical connections. The process then ends at step 2026.

Figure 23:
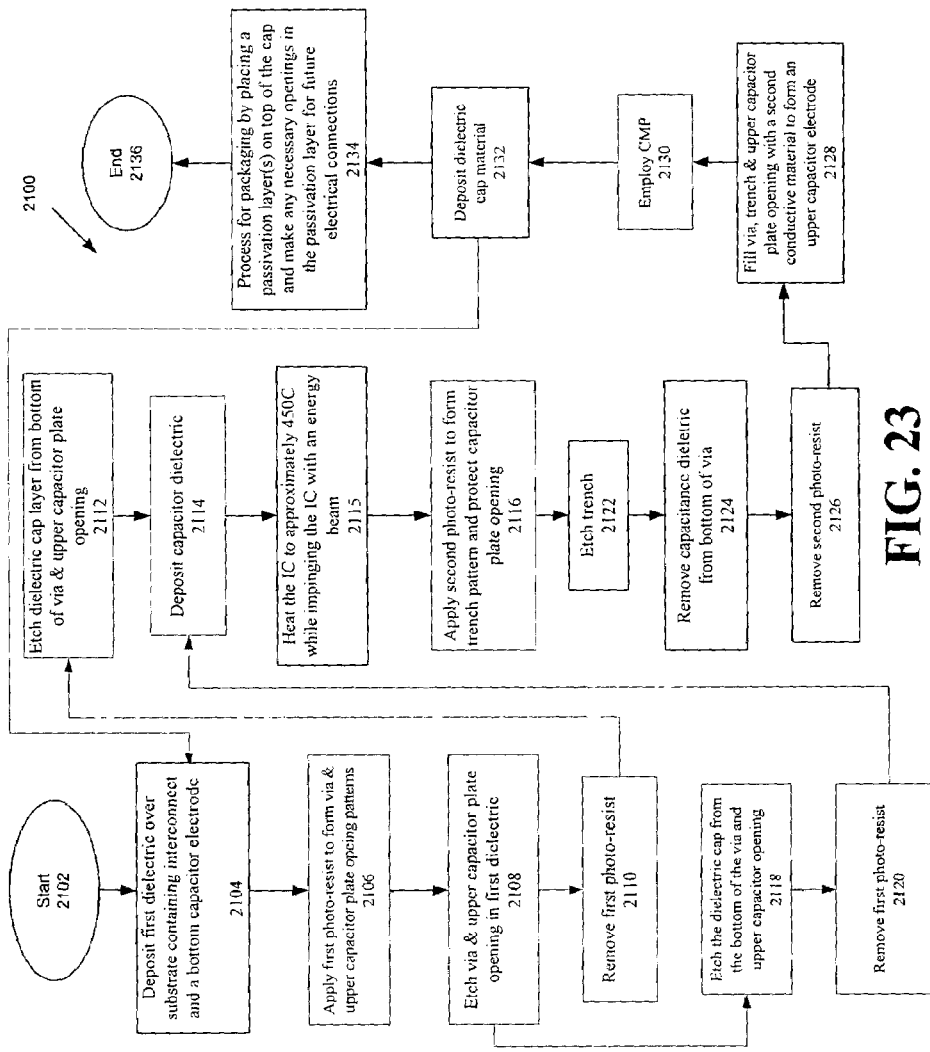
FIG. 23 is a flow chart of another exemplary embodiment of the method of the invention for fabricating on-chip planar capacitors.

A flow chart showing the second example method 2100 for forming an integrated (such as a MIM, MIS, PIS or PIP) on-chip capacitor is shown in FIG. 23. The process begins at 2102 and then a first dielectric material is deposited over a first material layer (containing lower interconnect and lower capacitor plate electrode (plate)) having a dielectric cap layer at step 2104. Examples of the first material may be first material layer 102, FIGS. 2 and 902, FIG. 10. At step 2106, a first photo-resist is applied to form patterns for a via and an upper capacitor plate opening. The via and upper capacitor plate openings are then etched at step 2108 into the first dielectric layer. The etch chemistry may be selective to the cap dielectric layer.

The example process then may proceed along two distinct approaches. In the first approach, the first photo-resist may be removed 2110 and the dielectric cap layer etched from the bottom of the via and the upper capacitor plate opening 2112. With an etch that is selective to first dielectric (i.e., etch the dielectric cap layer without etching the first dielectric layer). An insulating layer (such as a capacitance dielectric) or capacitor dielectric layer is then deposited at step 2114 and the IC is heated to equal to or less than 450C (such as below 400C) while the IC is impinged with an energy beam in step 2115. A second photo-resist is then applied at step 2116 to form a trench pattern. The second photo-resist also functions to protect the upper capacitor plate opening.

In the second approach, after step 2108, the cap dielectric material is removed from the bottom of via and upper capacitor plate opening in step 2118. The first photo-resist is removed in step 2120 and the capacitance dielectric or capacitor dielectric layer is then deposited at step 2114. The second photo-resist is applied at step 2116 to form a trench pattern. The second photo-resist also function to protect the upper capacitor plate opening.

The trench is etched into the capacitor dielectric layer and the first dielectric layer at step 2122 and the capacitance dielectric layer is removed from the bottom of the via at step 2124. At step 2126, the second photo-resist is removed. The via, trench, and upper capacitor plate opening are then filled with conductive materials, such as copper, at step 2128. CMP is then employed at step 2130 to remove excess conductive materials after filling the via, trench and upper capacitor plate opening. In addition, the capacitance dielectric layer on the wafer surface can be removed by CMP to reduce interconnect parasitic capacitance. A dielectric cap layer may is deposited over the structure at step 2132. The entire process for simultaneously forming an interconnect and on-chip capacitor may be repeated by returning to step 2104 in order to continue fabricating the next level of interconnects and/or on-chip capacitors. When all desired levels are fabricated, the IC may be processed for packaging, in step 2134, by placing a passivation layer(s) on top of the cap and make any necessary openings in the passivation layer for future electrical connections. The process then ends at step 2136.

Additional optional steps may also be performed with both the first and second example methods as previously described with reference to FIGS. 2 to 9 and FIGS. 10 to 21.

FIGS. 24 through 35 show a third example method for fabricating on-chip capacitors having high precision, good matching, low parasitics, high Q, and high density at low cost. In this example method the on-chip capacitor is a trench capacitor instead of a planar capacitor. Trench capacitors typically provide higher density of capacitance and occupy a smaller chip area than similar planar capacitors. This third example method produces trench on-chip capacitors possessing high capacitance precision, accurate capacitance matching, and high Q, that results in lower series resistance of the electrodes. Similar to the first and second example methods, this third example process begins with a semiconductor wafer substrate containing previously fabricated devices and/or interconnect structures. On top of the substrate, there is a material layer having conductive regions separated by insulation regions and the material layer is covered by a cap layer.

Figure 24:
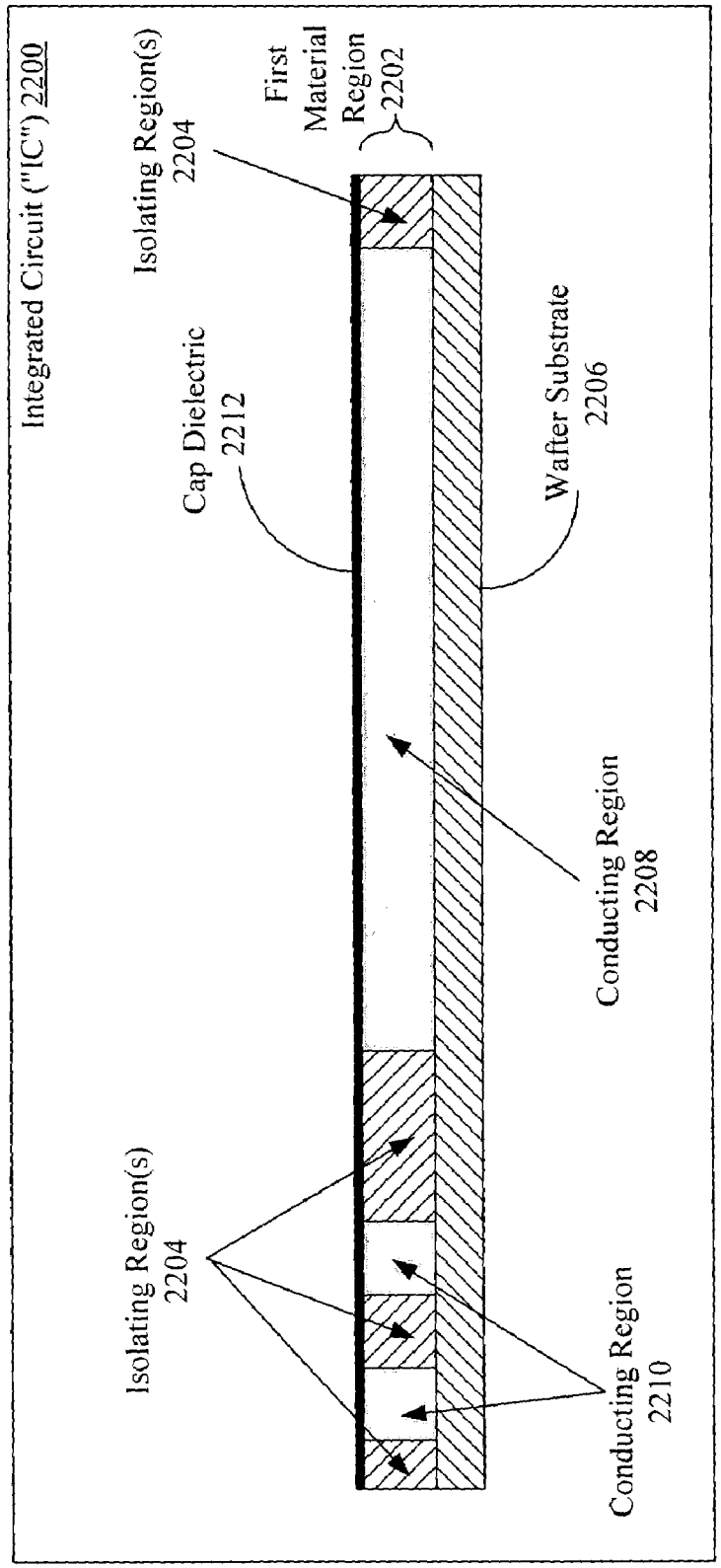
FIG. 24 is a cross-section of part of an IC having a first material layer that includes a conductive material on a substrate where the conductive material regions are separated by insulating material regions, and a cap dielectric layer deposited over the conductive and the insulating materials.

FIG. 24 shows a partial cross-section of and IC 2200 formed with known processing having a first material layer 2202 including an insulating region 2204 such as a dielectric over a wafer substrate 2206. The insulating region 2204 may be formed from silicon and act to isolate conductive region (s) 2208 and 2210 where some of the conductive regions serve as a lower capacitor plate 2208. These conductive regions 2208 and 2210 may be filled with a metal (such as copper and its barrier layer or other similar conductive metal), a polysilicon, or diffusion area on a silicon substrate. A dielectric cap layer 2212 is deposited over the material layer 2202. Examples of the dielectric layer 2204 and the cap dielectric layer 2212 include the same materials listed in reference to the dielectric layer 104 and the cap dielectric layer 112 in FIG. 2. In addition, examples of the material utilized to form the interconnect 106 and the lower capacitor plate 2208 may be a metal, polysilicon, or diffusion area on a silicon substrate such as those previously described with reference to the interconnect 106 and the lower capacitor plate 110 shown in FIG. 2. However, for ease in describing the third example method, copper will be employed as the material for forming the lower interconnect 2210 and the lower capacitor plate 2208. It is appreciated by those skilled in the art that other similar metals also may be utilized.

Figure 25:
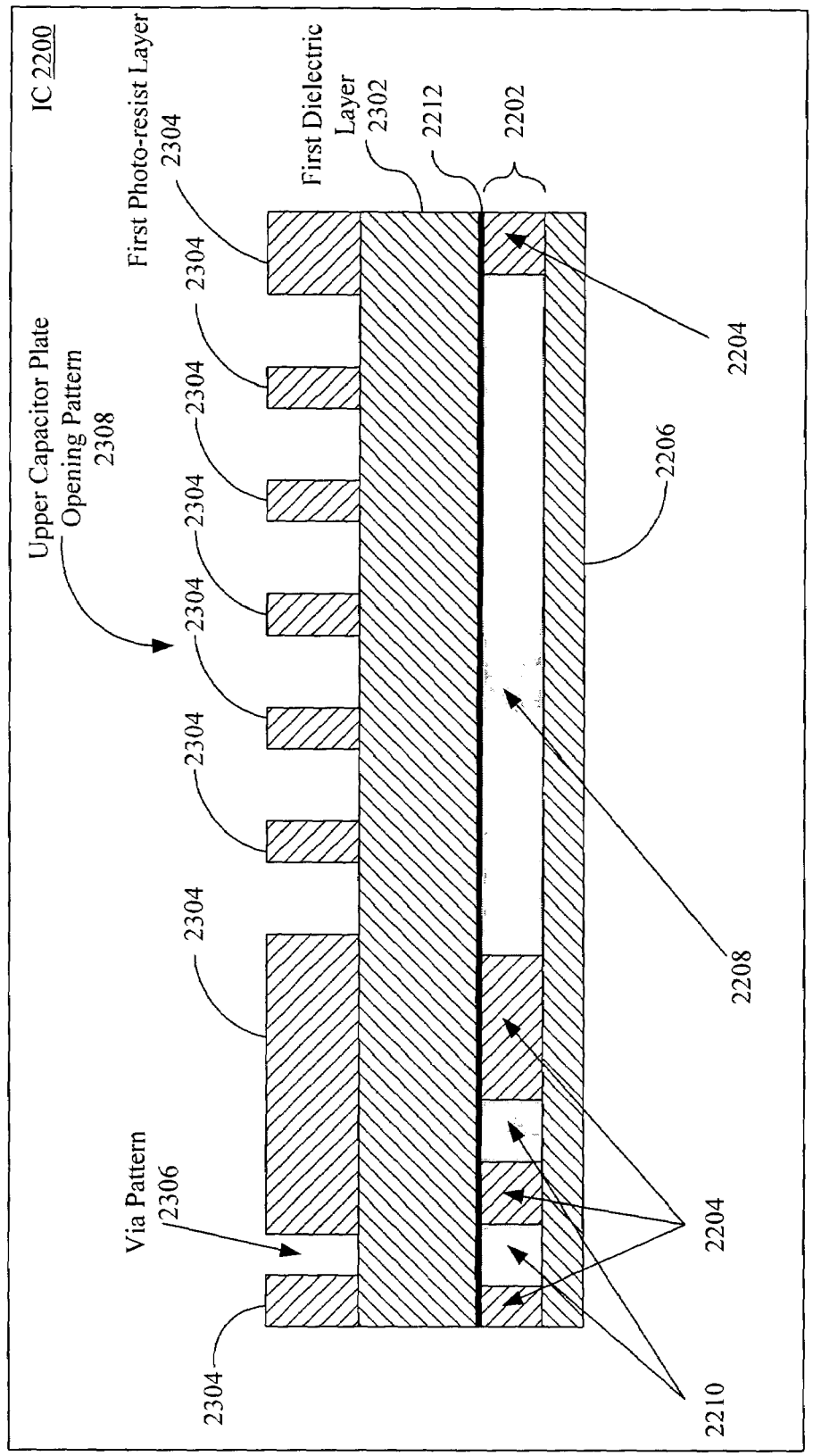
FIG. 25 is a cross-section of the partial IC shown in FIG. 24 after applying a second dielectric layer and a second photo-resist.
Figure 26:
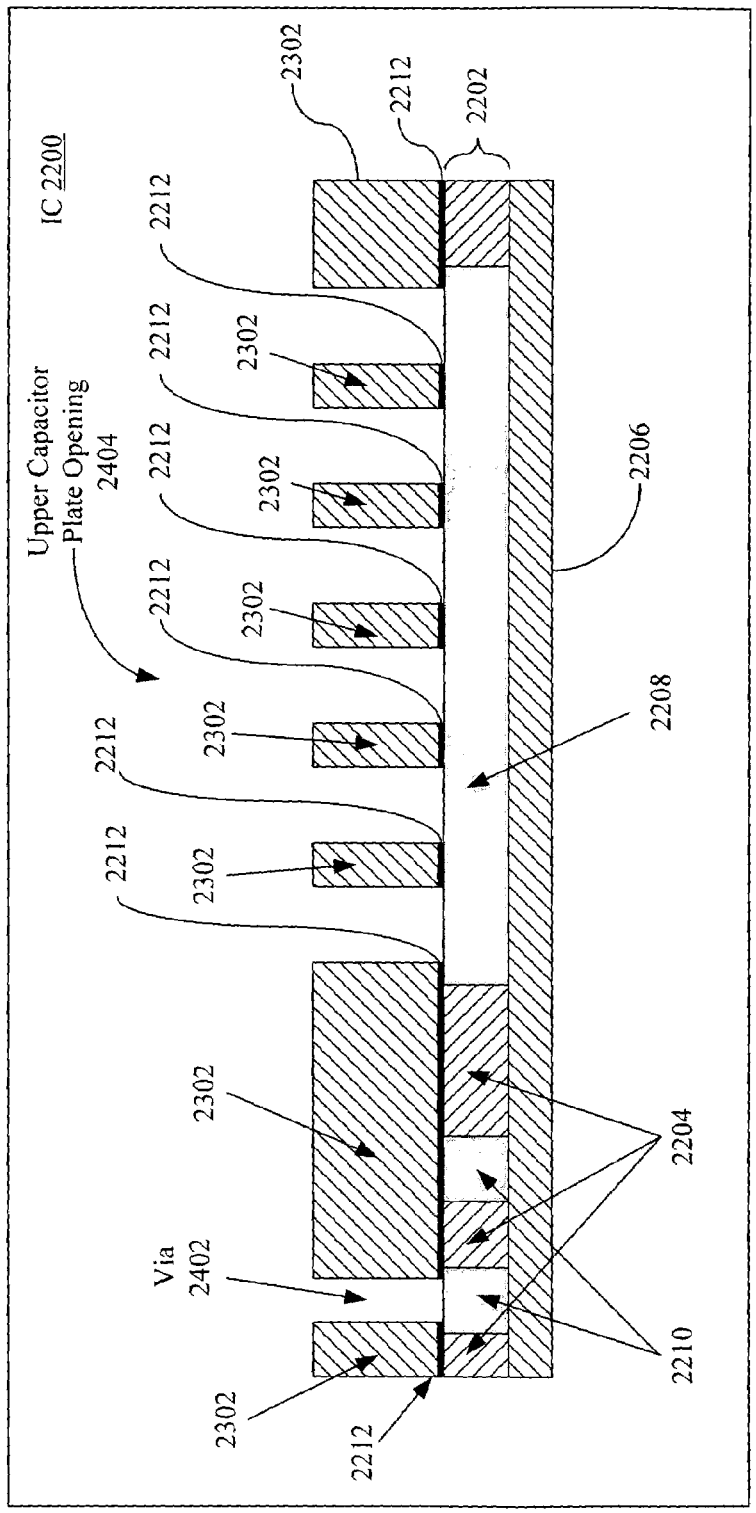
FIG. 26 is a cross-section of the partial IC shown in FIG. 25 after etching a corrugated upper capacitor plate opening.

In a first step of the third example method for fabricating a trench on-chip capacitor, at least one via and at least one opening for an upper capacitor plate are simultaneously formed in a first dielectric material that is deposited on the surface of the structure shown in FIG. 25. This step of simultaneously forming a via and upper capacitor opening includes the steps of (i) depositing a first dielectric layer 2302 over the cap dielectric layer 2212 shown in FIG. 25, (ii) applying a first photo-resist layer 2304 over the first dielectric layer 2302 to form a via pattern 2306 and an corrugated upper capacitor plate opening pattern 2308 as shown in FIG. 25, (iii) etching the via 2402 and upper capacitor plate opening 2404 in the first dielectric layer 2302 as shown in FIG. 26, and (iv) stripping the first photo-resist layer 2304 on the first dielectric layer 2302 as shown in FIG. 26. The dielectric cap layer 2212 is removed either before or after stripping the first photo-resist layer 2304. The dielectric cap layer 2212 and first photo-resist layer 2304 may be similar to dielectric cap layer 112, FIG. 4, and first dielectric layer 202, FIG. 3, respectively, in both thickness and composition.

Figure 27:
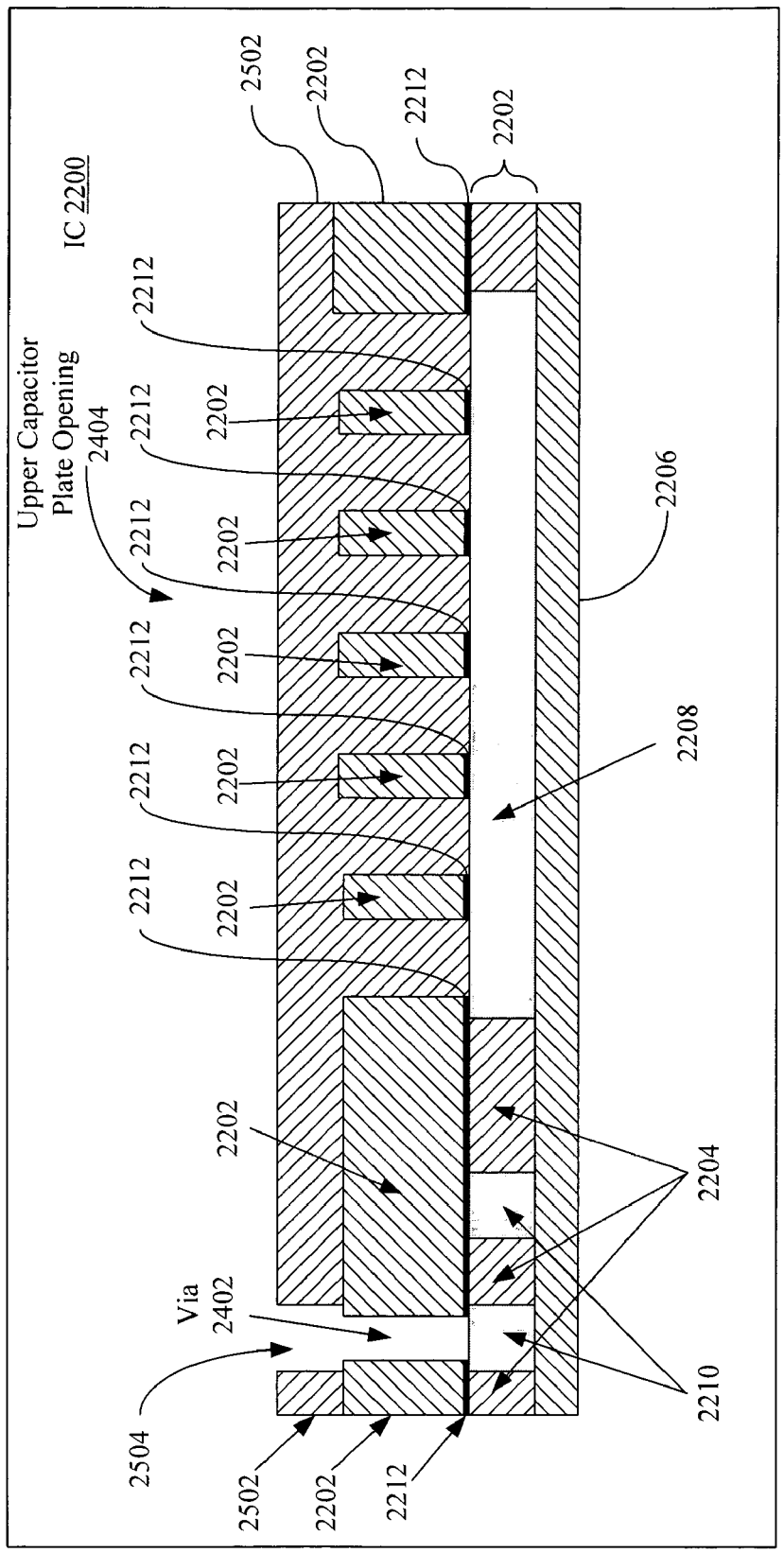
FIG. 27 is a cross-section of the partial IC shown in FIG. 26 after applying another photo-resist layer to form a trench pattern at the top of the via.
Figure 28A:
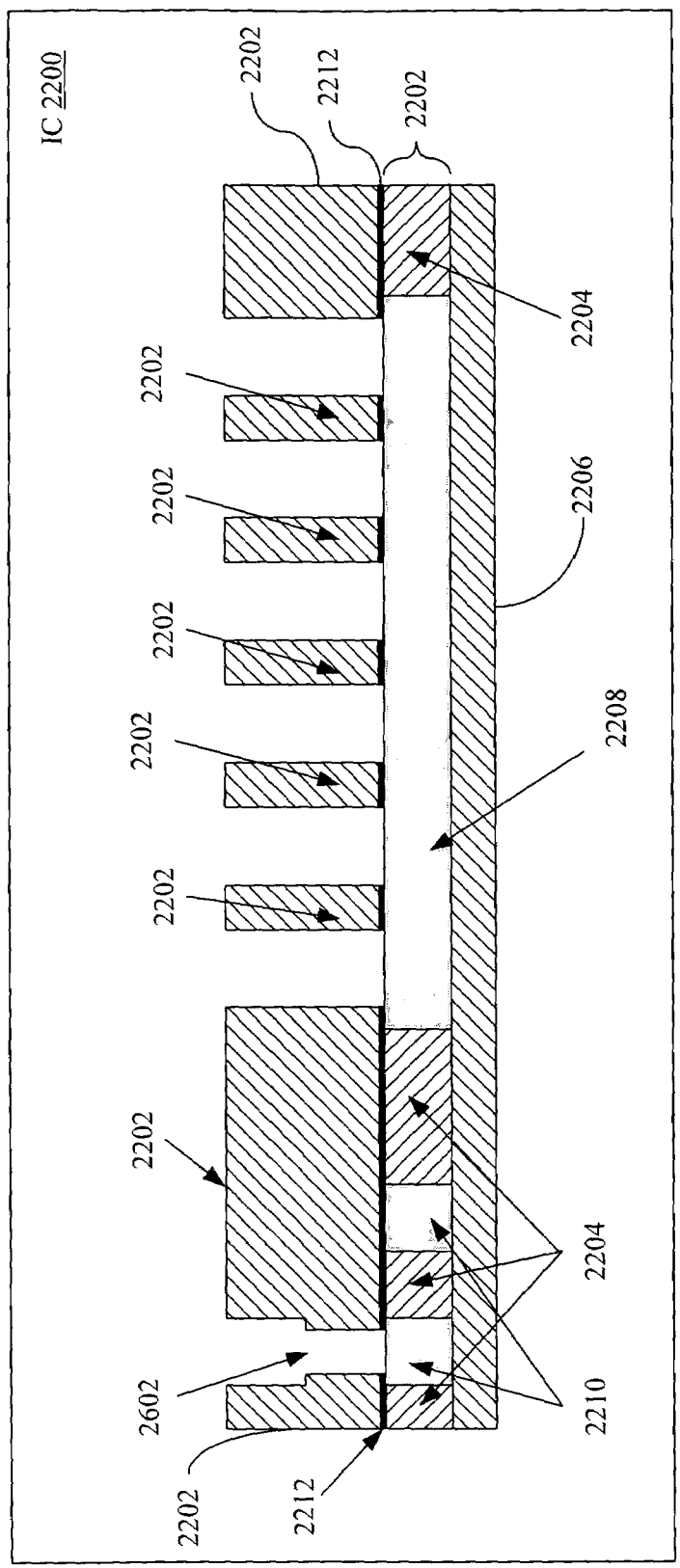
FIG. 28A is a cross-section of the partial IC shown in FIG. 27 after etching the trench and removing the photo-resist.
Figure 28B:
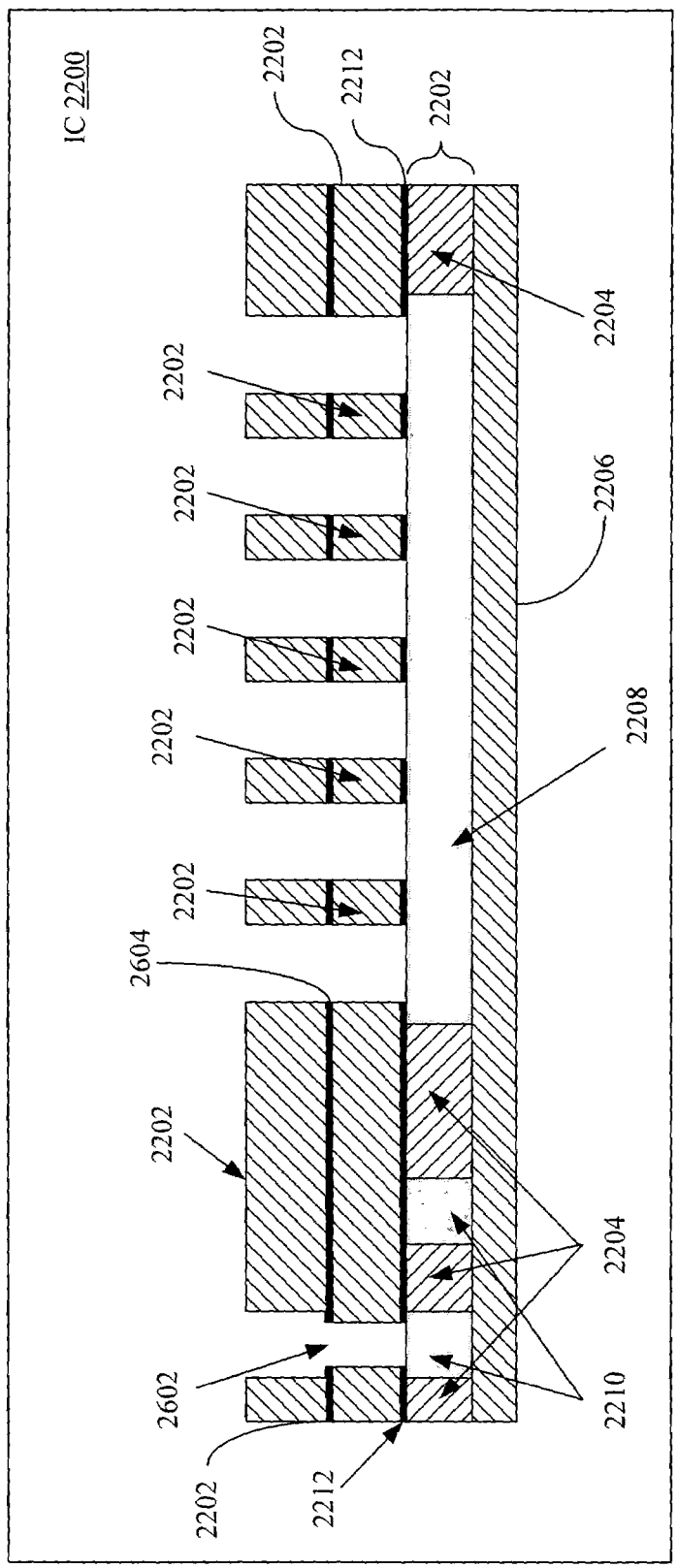
FIG. 28B is a cross-section of the partial IC shown in FIG. 27 utilizing another optional dielectric layer that may be employed to stack up the dielectric material on IC shown in FIG. 27.

In FIG. 27, a trench above via 2402 may be formed to fabricate an interconnect that serves as a connection to previously fabricated devices or interconnects. This step may include forming additional trenches and may also include several sub-steps such as applying, etching, removing and stripping. FIG. 27 shows the sub-step of applying a second photo-resist 2502 over the first dielectric layer 2202 having the via 2402 and corrugated upper capacitor plate opening 2404 formed within the first dielectric layer 2202. The second photo-resist 2502 forms a trench pattern 2504 above the via 2402 as shown in FIG. 27. The second photo-resist also functions to protect the corrugated upper capacitor plate opening 2404. FIG. 28A shows the sub-step of etching a trench 2602 in the first dielectric layer 2202 directly above the via 2402 and the sub-step of stripping the second photo-resist 2502 from the structure resulting from the applying sub-step. FIG. 28B shows the optional utilization of another dielectric layer 2604 that may be utilized to serve as an etch-stop layer in first dielectric layer 2202 during the trench etch.

Figure 29:
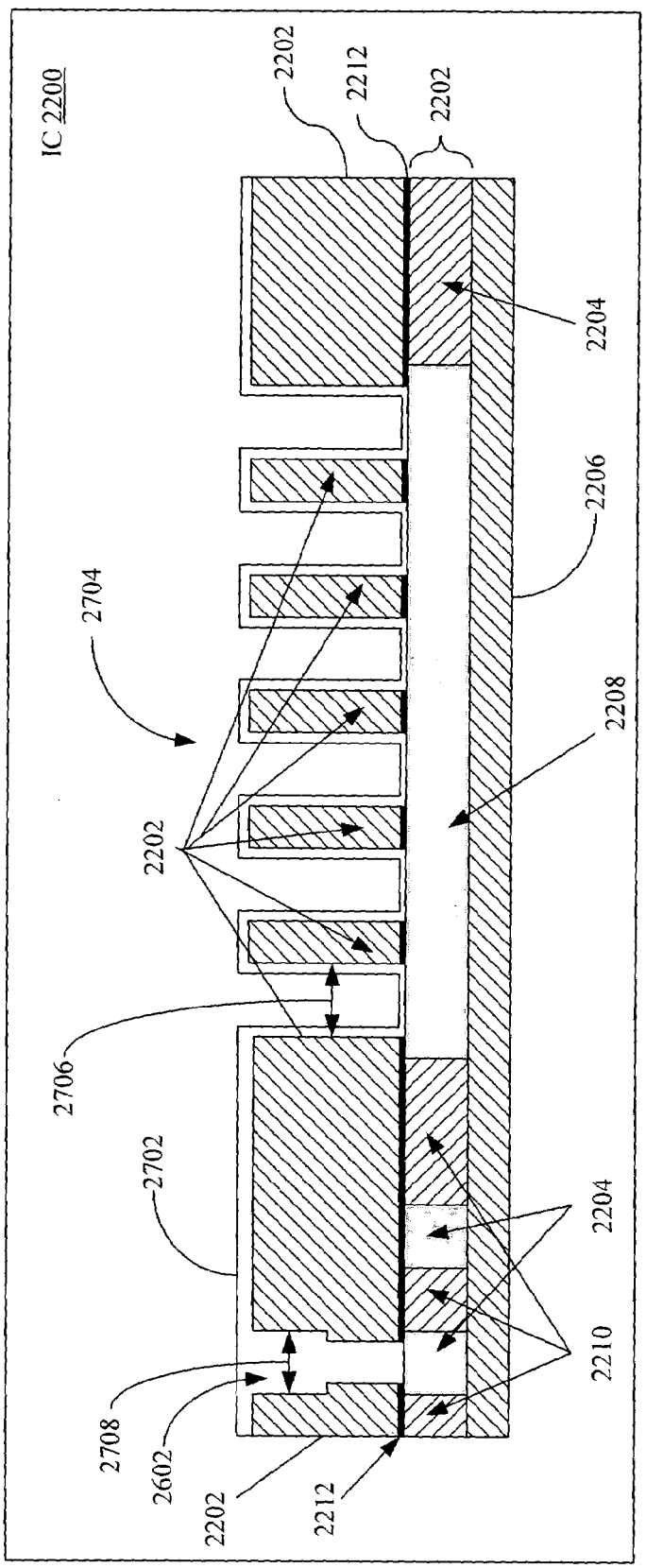
FIG. 29 is a cross-section of the partial IC shown in FIG. 28A after applying a second conductive material on the structure.
Figure 30:
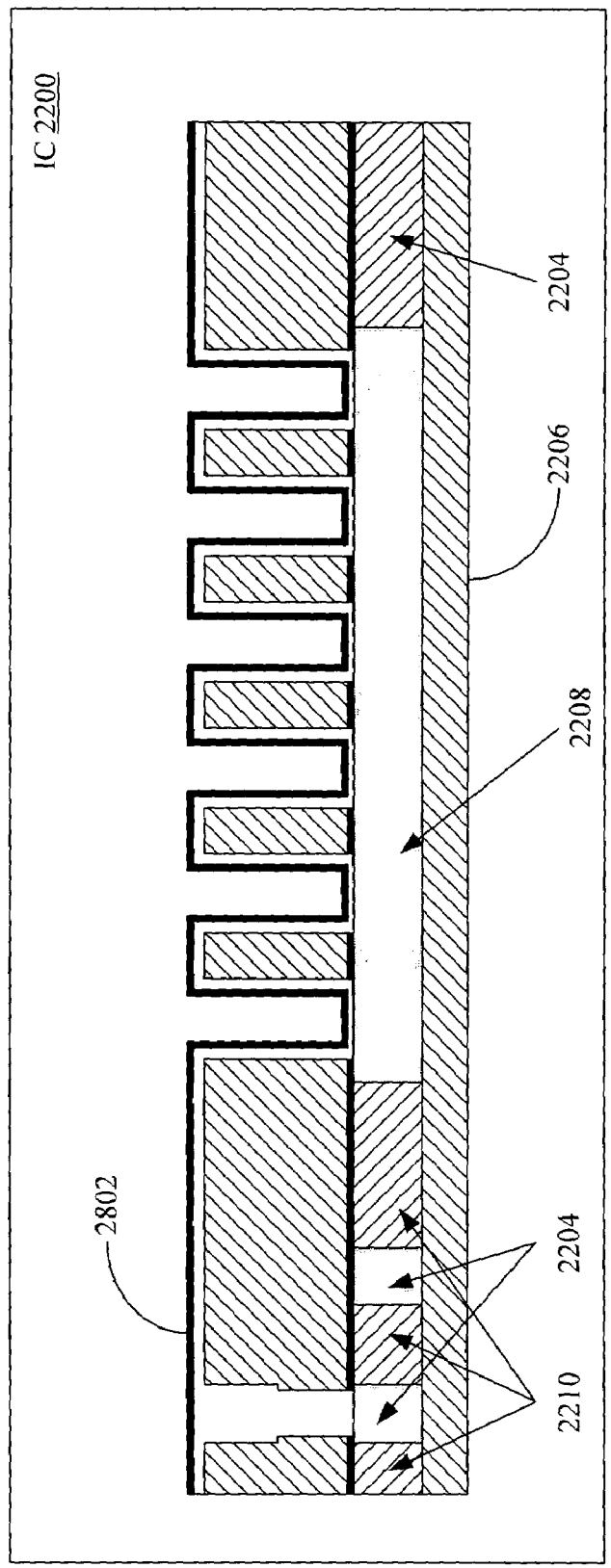
FIG. 30 is a cross-section of the partial IC shown in FIG. 29 after applying a capacitance dielectric or insulating material on the second conductive material of FIG. 29.

Next, a second conductive material 2702 is deposited on top of the IC 2200 in FIG. 29. The conductive material 2702 fills via 2402 and trench 2602 completely. However, it only partially fills corrugated upper plate opening 2704. The second conductive material 2702 may be formed by any appropriate conductive material such as, but not limited to, metal (such as copper and its barrier layers, aluminum, tungsten or other equivalent type conductive material), or a polysilicon. It is appreciated that because width 2706 of the individual openings in corrugated upper plate opening 2704 are wider than the width 2708 of trench 2602, the individual opening in the corrugated upper plate opening 2704 are only partially filled with second conductive material 2702 while trench 2602 is completely filled with second conductive material 2702 in the same process step. In FIG. 30, a third dielectric layer 2802 is deposited on top of the conductive material 2402. The third dielectric layer 2802 may include a dielectric such as $SiO_2$, SiN, $Al_2O_3$, SiC, $HfO_2$, HfON, HfSiON, $ZrO_2$, $ZrO_2$, etc., or any other similar material that may be suitable for functioning as an insulator in an on-chip capacitor. The third dielectric layer 2802 fills in the partially filled corrugated upper capacitor plate opening and does not fill in the vias or trenches at all because the vias and trenches have been completely filled by the second conductive material 2702.

Figure 31:
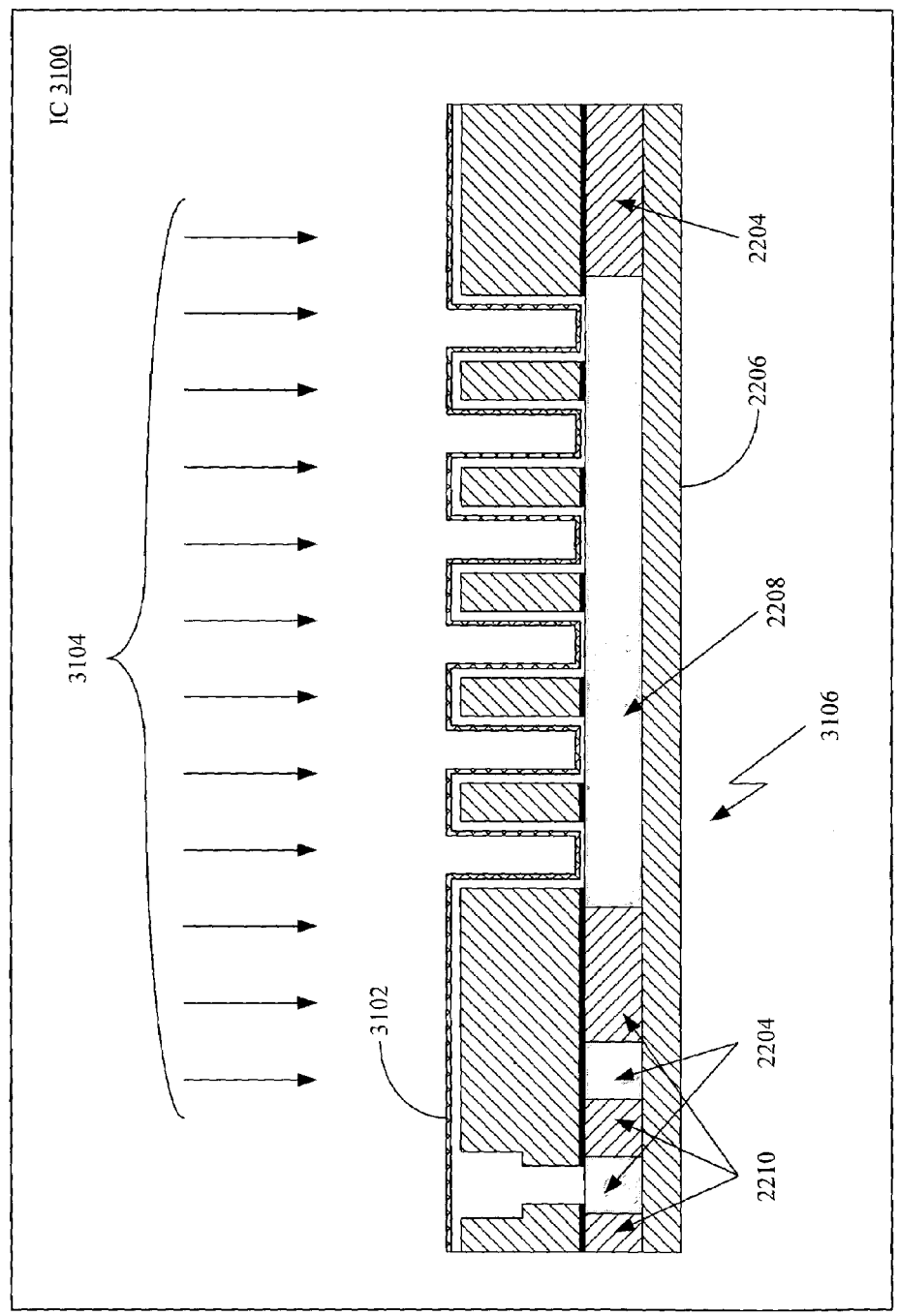
FIG. 31 is a cross-section of the partial IC shown in FIG. 30 being impinged with an energy beam while being annealed with heat source.

In FIG. 31, the IC 3100 is annealed by heat source 3106 and impinging energy beam 1304. The heat source 3106 may be applied from below (as shown) or from all sides as in an oven-type environment (not shown). The energy beam 1304 may include any type of appropriate energy such as but not limited to an electron-beam, electromagnetic radiation, radio frequency ("RF"), microwave radiation, millimeter wave radiation, ion-beam, light beam, ultra-violet light or other similar type of energy injection. The energy beam 1302 may preferably be directed towards the IC 3100 as a plan wave so that the entire surface area of IC 3100 is impinged equally with the energy beam 3104. The heat source 3106 may be operated at a temperature preferably equal to or below 450C (such as below 400C) in order to be compatible with a BEOL process. The intensity of the energy beam 1302 is preferably chosen so as to increase (in combination with the heat source 3106) the dielectric constant of the cap dielectric layer 2802, FIG. 30.

FIG. 31 shows the resulting IC 3100 structure from annealing with energy source 3106 and impinging with energy beam 1302. In FIG. 31, the cap dielectric layer 3102 has been modified so that the dielectric value treated cap dielectric layer 3102 is now higher than the dielectric value of the original untreated cap dielectric layer 2802 and may be approximately twice as much as the original dielectric value of the cap dielectric layer 2802. As an example, if the dielectric layer 2802 is $Ta_2O_5$, the original dielectric value is approximately equal to 22. However, after annealing by heating with heat source 503 and impinging with energy beam 501, the dielectric value may be raised to approximately 40. As another example, this annealing process of heating and impinging would typically raise the dielectric constant values of SiN and SiC to approximate values of 7 and 5, respectively.

Figure 32:
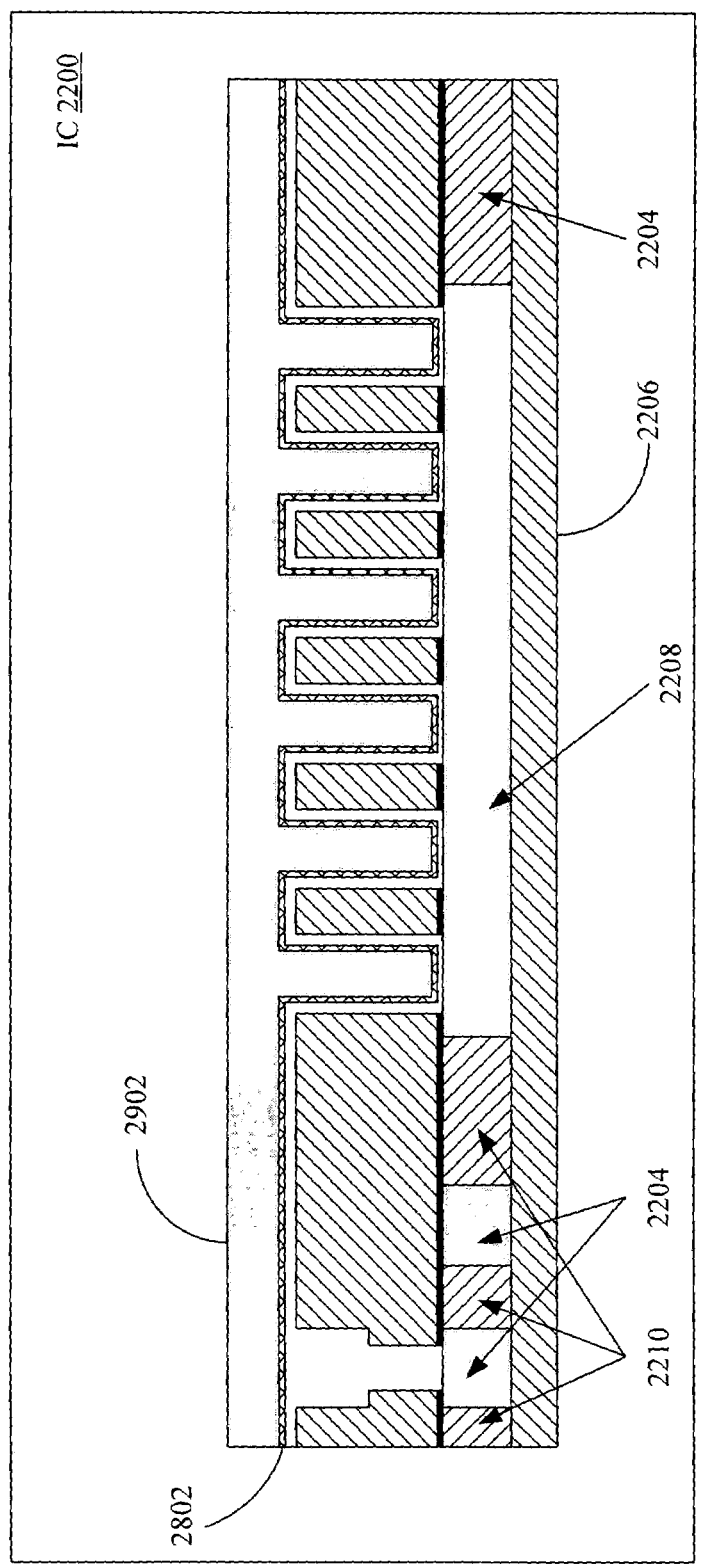
FIG. 32 is a cross-section of the partial IC shown in FIG. 31 after applying a third conductive material on the structure.
Figure 33:
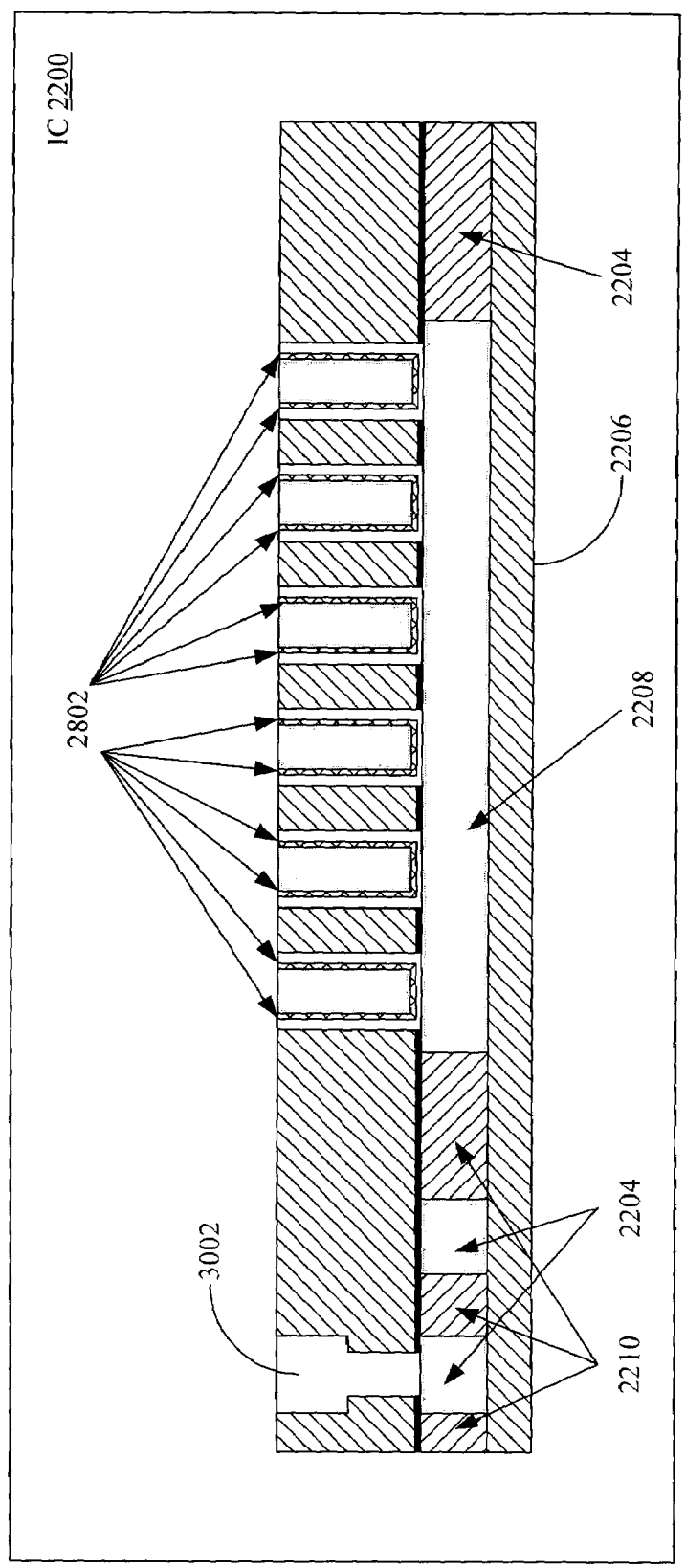
FIG. 33 is a cross-section of the partial IC shown in FIG. 32 after employing CMP to remove excess conductive material and capacitance dielectric from the wafer surface.

In FIG. 32, a third conductive material 2902 is deposited on the third dielectric layer 2802. Similar to the second conductive material 2702, the third conductive material 2902 may be formed by any appropriate conductive material such as, but not limited to, metal (such as copper and its barrier layer, aluminum, tungsten or other equivalent type conductive material), or a polysilicon. In FIG. 33, CMP is utilized to remove excess second and third conductive material 2702 and 2902 and third dielectric layer 2802 from the structure. The resulting structure from carrying out this last step is shown in FIG. 33. FIG. 33 shows a trench on-chip integrated (such as an MIM, MIS, PIS and/or PIP) capacitor having an upper capacitor plate (also known as an electrode) formed from third conductive material 2902, a lower capacitor electrode formed from second conductive material 2702 and conductive material 2208, and an insulating layer formed from the third dielectric layer 2802 having a composition previously described with reference to the first and second example methods. FIG. 33 also shows interconnects 3002.

Figure 34:
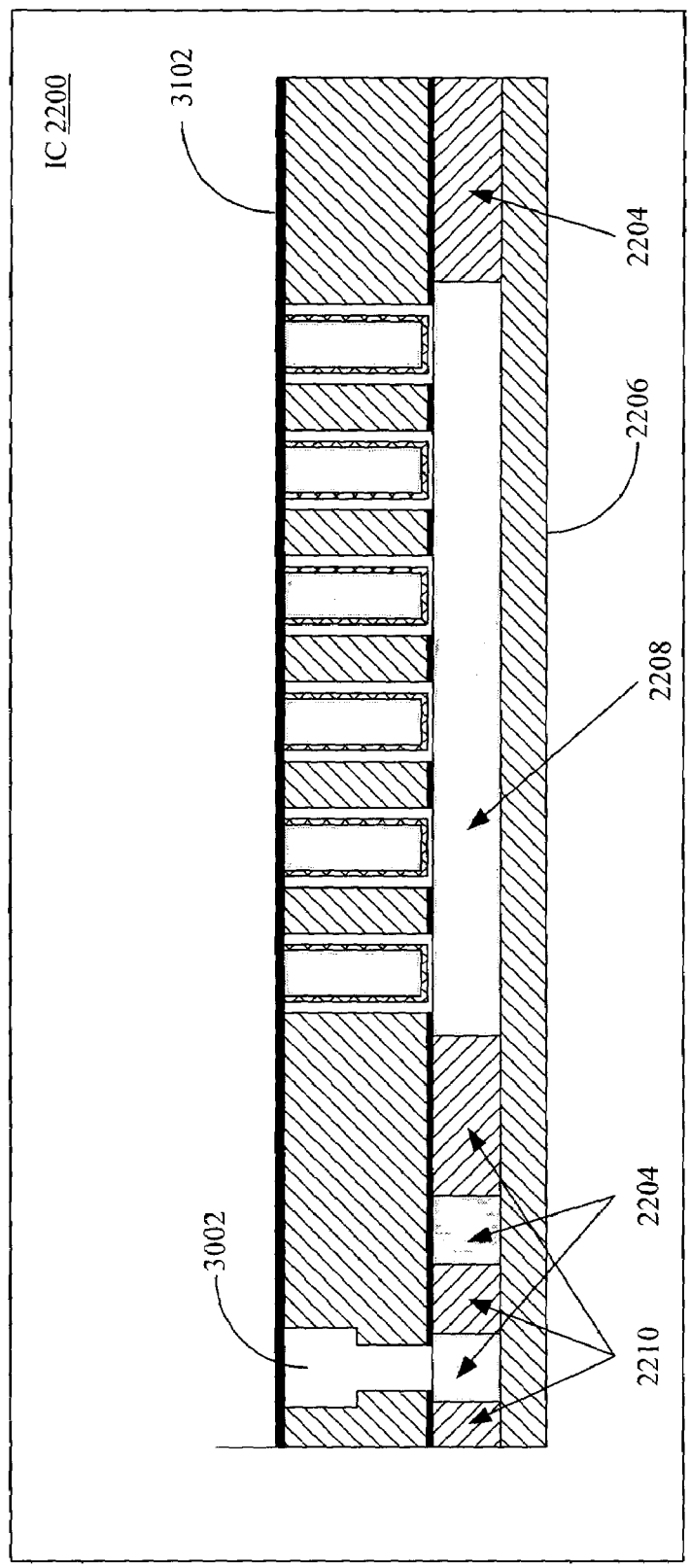
FIG. 34 is a cross-section of the partial IC shown in FIG. 33 after depositing a dielectric barrier layer over the IC shown in FIG. 33.

Similar to the first and second example methods for forming an on-chip capacitor, a dielectric cap layer 3102 is deposited over the surface of the structure resulting after the step of employing CMP may also be performed in FIG. 34. Also, similar to the first example method, additional optional steps including 1) the step of performing an etch stop within the first dielectric layer to aid in forming the trench and via and 2) the step of depositing a metal barrier layer prior to depositing the copper layer to form the second and the third conductive materials, respectively, may also be included. The second conductive material and third conductive material may be similar to the second conductive material 702 in the first exemplary method.

Figure 35:
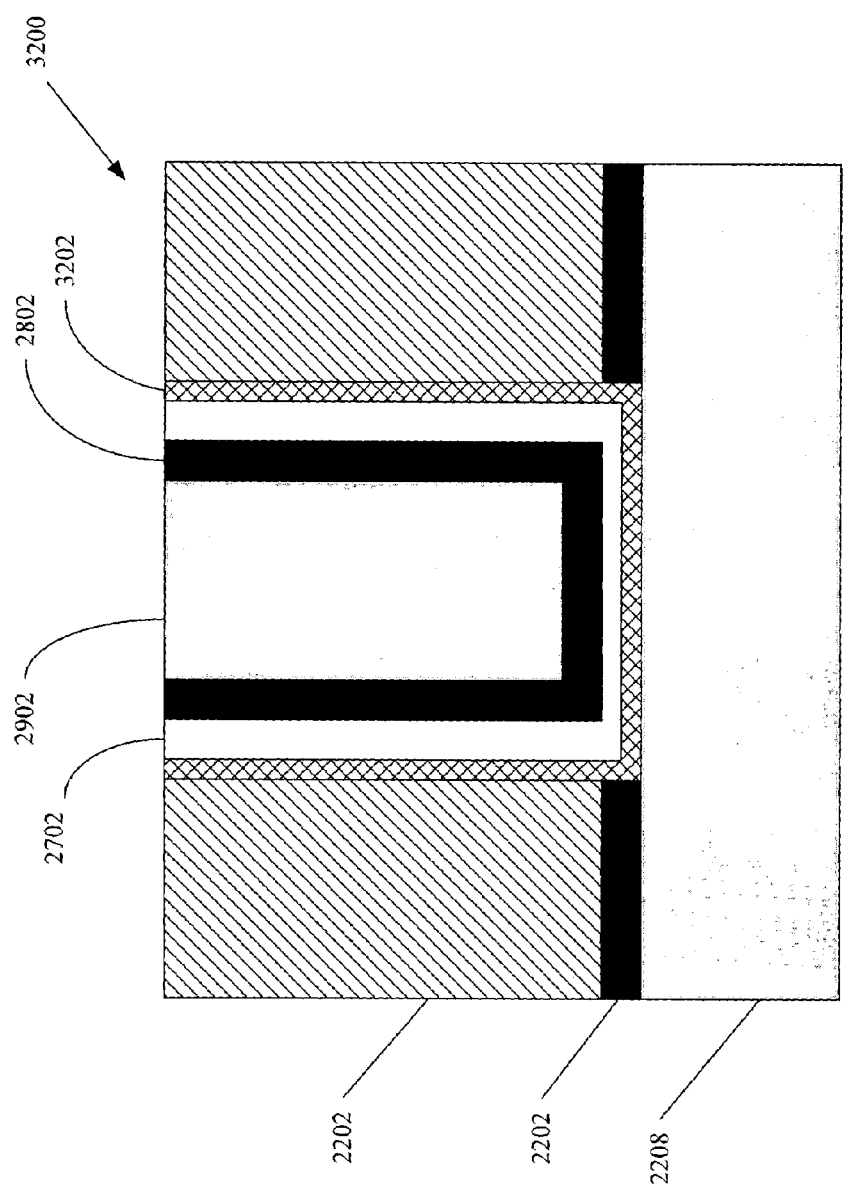
FIG. 35 is a top view of the exemplary embodiment of the invention described in FIG. 24 through FIG. 34.

FIG. 35 is a cross-sectional view of one of the openings 3200 in the corrugated upper capacitor plate opening 2704. FIG. 35 shows the relationship of the second conductive material 2702 and the barrier layer 3202 of the second conductive material 2702.

Figure 36:
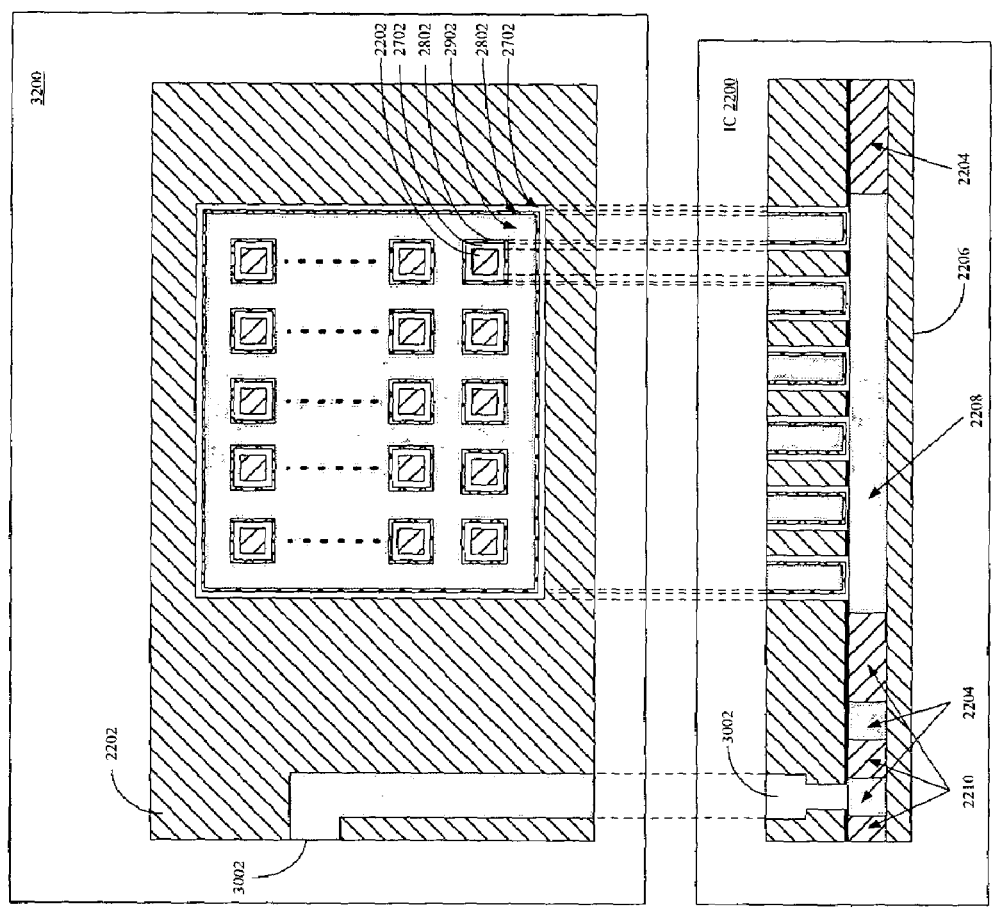
FIG. 36 is a flow chart of another exemplary embodiment of the method of the invention for fabricating on-chip capacitors described by FIG. 24 through FIG. 34.

FIG. 36 shows an example of a top view and cross section view of IC 3100. In FIG. 33, an example top view of the corrugated top capacitor electrode opening is show. It is appreciated by those skilled in the art that the spacing dimension 2706, FIG. 29, is a process dependent parameter, that the second conductive material 2702 may be electroplated to completely fill the vias and trenches by conformal deposition or bottom-up deposition. At the same time, corrugated upper capacitor electrode opening only becomes partially filled because of the releatively large dimension 2706. This process may be realized by controlled the surfactant and additives in the plating solution.

Figure 37:
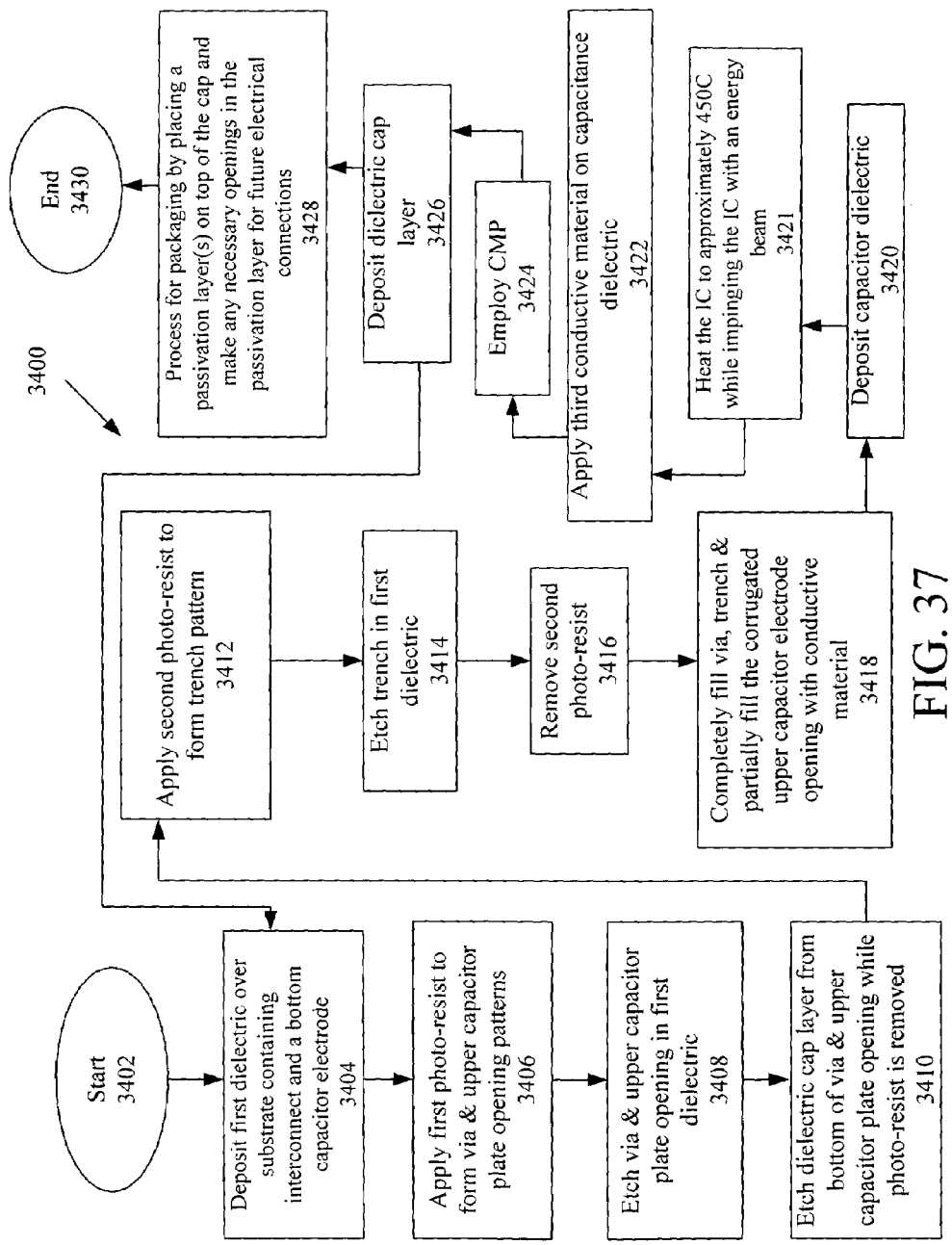
FIG. 37 is a flow chart of another example of a method for fabricating on-chip capacitors.

FIG. 37 is a flow chart showing the third example method 3400 for forming an integrated on-chip capacitor such as a MIM, MIS, PIS or PIP capacitor. The process begins at 3402 and then a first dielectric material is deposited over interconnect and bottom capacitor electrode, having a dielectric cap layer at step 3404. At step 3406, a first photo-resist is applied to form patterns for the via and the upper capacitor electrode opening. The via and upper capacitor plate openings are then etched at step 3408 into the first dielectric layer. Next, the dielectric cap layer is etched from the bottom of the via and the upper capacitor electrode opening while the first photo-resist is removed at step 3410. In step 3412, a second photo-resist is applied to the structure to form a trench pattern on the structure. The trench pattern may include a trench pattern above the via and a plurality of trench patterns. Second photo-resist also functions to protect upper capacitor electrode opening. The trenches are etched in step 3414 and in step 3416, the second photo-resist is removed. The via and trench are completely filled, and upper capacitor electrode opening is partially filled with conductive materials, such as copper, at step 3418. A capacitor dielectric, or insulator material, is applied to the structure in step 3420 and the IC is heated (annealed) to preferably approximately equal to or less than 450C (such as below 400C) and impinged with an energy beam in step 3421. A third conductive material is then deposited on the capacitor dielectric in step 3422.

CMP is then employed at step 3424 to remove excess conductive materials and capacitor dielectric. A cap dielectric material layer is then deposited on the structure at step 3426. The entire process for simultaneously forming an interconnect and on-chip capacitor may be repeated by returning to step 3404 in order to continue fabricating the next level of interconnects and/or on-chip capacitors. When all desired levels are fabricated, the IC may be processed for packaging, in step 3428, by placing a passivation layer(s) on top of the cap and make any necessary openings in the passivation layer for future electrical connections. The process then ends at step 3430.

While various embodiments of the invention have been described, it will be apparent to those of ordinary skill in the art that many more embodiments and implementations are possible that are within the scope of this invention.

What is claimed is:

1. A method for fabricating a capacitor on a semiconductor substrate, the method comprising:
    simultaneously forming at least one via and at least one upper capacitor plate opening in a first dielectric layer having an underlying cap dielectric layer deposited over a first material region having a first conductive material within a conductive region, whereby the at least one via exposes a via area of the cap dielectric layer and the at least one upper capacitor plate opening exposes an upper capacitor plate opening area of the can dielectric layer;
    simultaneously heating the cap dielectric layer with a heat source and impinging the exposed via area and exposed upper capacitor plate opening area of the cap dielectric layer with an energy beam, whereby the cap dielectric layer is modified in the via area and the upper capacitor plate opening area such that the dielectric values of the via area and the upper capacitor plate opening area are higher than the dielectric value of the remaining portions of the dielectric layer;
    forming a trench above the via; and
    filling the via, trench, and upper capacitor plate opening with a second conductive material resulting in an integrated circuit structure.

2. The method of claim 1, wherein the step of simultaneously forming a via and an upper capacitor plate opening in a first dielectric layer further includes:
    depositing the first dielectric layer over the cap dielectric layer;
    applying a first photo-resist over the fist dielectric layer to form a pattern for the via and the upper capacitor plate opening;
    etching the via and the upper capacitor plate opening in the first dielectric layer; and
    stripping the first photo-resist from the first dielectric layer.

3. The method of claim 2, wherein the step of forming a trench above the via includes:
    applying a second photo-resist over the first dielectric layer having a via and upper capacitor plate opening contained therein to form a trench pattern above the via;
    etching the trench in the first dielectric layer and removing the cap dielectric layer from a bottom of the via resulting in an etched structure; and
    stripping the second photo-resist from the etched structure.

4. The method of claim 1, wherein the cap dielectric layer functions as an insulator of the capacitor.

5. The method of claim 1, wherein the first conductive material and second conductive material comprise at least one of a metal, a polysilicon, or a silicon substrate.

6. The method of claim 5, wherein the first conductive material and second conductive material each include a metal to form a metal-insulator-metal ("MIM") capacitor.

7. The method of claim 1, wherein the at least one via has a via height and the trench has a trench height, and the upper capacitor plate opening has upper capacitor plate opening height that is approximately equal to a combined height of the via height and the trench height.

8. The method of claim 1, wherein the cap dielectric layer is heated to a temperature equal to or less than 450C.

9. The method of claim 8, wherein the cap dielectric layer is heated to a temperature equal to or less than 400C.

10. The method of claim 1 comprising employing CMP to remove any excess second conductive material from the integrated circuit structure.

11. The method of claim 5, wherein the first conductive material and second conductive material each include a polysilicon to form a polysilicon-insulator-polysilicon ("PIP") capacitor.

12. The method of claim 5, wherein the first conductive material includes a metal and the second conductive material includes a silicone substrate to form a metal-insulator-silicon ("MIS") capacitor.

13. The method of claim 5, wherein the first conductive material includes a polysilicon and the second conductive material includes a silicone substrate to form a polysilicon-insulator-silicon ("PIS") capacitor.

* * * * *

UNITED STATES PATENT AND TRADEMARK OFFICE
CERTIFICATE OF CORRECTION

PATENT NO. : 7,060,557 B2 Page 1 of 1
APPLICATION NO. : 10/190297
DATED : June 13, 2006
INVENTOR(S) : Zhao et al.

It is certified that error appears in the above-identified patent and that said Letters Patent is hereby corrected as shown below:

<u>Title Page</u>  Inventor

In the inventor information, the city for Maureen R. Brongo should be changed from "Laguna Beach" to --Ladera Ranch--.

Abstract

In the Abstract, line 10, "and energy beam" should be --an energy beam--.

Specification

In the Specification, column 8, line 8, please remove "fin";

Column 12, line 18, "includes" should be --include--.

Column 14, line 7, "layer may is deposited" should be --layer may be deposited--; column 14, line 23, add a "," after "example".

Column 15, line 3, "an" should be --a--.

Column 16, line 67, "show" should be --shown--.

Column 17, line 7, "releatlvely" should be --relatively--; line 8, "controlled" should be --controlling--; line 47, "and" should be changed to --to--; line 64, "can" should be --cap--.

Column 18, line 16, "fist" should be changed to --first--.; line 49, "claim 8" should be changed to --claim 11--.

Signed and Sealed this

Fifth Day of December, 2006

JON W. DUDAS
*Director of the United States Patent and Trademark Office*